(12) United States Patent
Kfouri et al.

(10) Patent No.: US 8,099,260 B2
(45) Date of Patent: Jan. 17, 2012

(54) ANALYSIS ERROR DETECTION FOR A CAD MODEL

(75) Inventors: Emile E. Kfouri, Newton, MA (US); Gregory P. Ingersoll, Derry, NH (US)

(73) Assignee: Autodesk, Inc., San Rafael, CA (US)

( * ) Notice: Subject to any disclaimer, the term of this patent is extended or adjusted under 35 U.S.C. 154(b) by 1069 days.

(21) Appl. No.: 11/460,524

(22) Filed: Jul. 27, 2006

(65) Prior Publication Data

US 2008/0027968 A1    Jan. 31, 2008

(51) Int. Cl.
*G06F 17/50* (2006.01)
*G06G 7/48* (2006.01)

(52) U.S. Cl. .................................... 703/1; 703/7
(58) Field of Classification Search ............... 703/1, 7
See application file for complete search history.

(56) References Cited

U.S. PATENT DOCUMENTS

| | | | |
|---|---|---|---|
| 5,268,998 A | 12/1993 | Simpson | |
| 5,444,836 A | 8/1995 | Hollingsworth et al. | |
| 5,557,537 A | 9/1996 | Normann et al. | |
| 5,856,828 A | 1/1999 | Letcher, Jr. | |
| 5,923,573 A | 7/1999 | Hatanaka | |
| 6,052,691 A | 4/2000 | Ardoin et al. | |
| 6,426,745 B1 | 7/2002 | Isaacs et al. | |
| 6,477,518 B1 | 11/2002 | Li et al. | |
| 6,567,772 B1 | 5/2003 | Hoeft | |
| 6,629,065 B1 | 9/2003 | Gadh et al. | |
| 6,651,037 B1 | 11/2003 | Hall et al. | |
| 6,683,620 B1 * | 1/2004 | Burke | 345/620 |
| 6,799,463 B2 | 10/2004 | Fields et al. | |
| 6,816,819 B1 | 11/2004 | Loveland | |
| 6,859,768 B1 | 2/2005 | Wakelam et al. | |
| 7,162,706 B2 | 1/2007 | Kuang et al. | |
| 7,246,044 B2 | 7/2007 | Imamura et al. | |
| 7,292,908 B2 | 11/2007 | Borne et al. | |
| 7,343,273 B2 * | 3/2008 | Kusunoki et al. | 703/7 |
| 2001/0033281 A1 | 10/2001 | Yoshida et al. | |
| 2003/0139907 A1 | 7/2003 | McCarthy | |
| 2003/0200062 A1 | 10/2003 | Dessureault et al. | |
| 2003/0208341 A9 | 11/2003 | Simmons et al. | |

(Continued)

FOREIGN PATENT DOCUMENTS

EP    1223520    7/2002

(Continued)

OTHER PUBLICATIONS

Cheng., "Computer Aided Drafting (CAD)", http://www.timeihk.com/TechnicalInfo/CadCam/CAD.pdf. Sep. 2001., p. 1-12.*

(Continued)

*Primary Examiner* — Paul Rodriguez
*Assistant Examiner* — Eunhee Kim
(74) *Attorney, Agent, or Firm* — Fish & Richardson P.C.

(57) ABSTRACT

Methods and apparatus, including computer program products, for identifying an analytical representation of a plurality of physical elements in a computer aided design (CAD) model, the analytical representation comprising a plurality of analytical elements. one or more of the plurality of analytical elements corresponds to one or more of the plurality physical elements. An association is identified between corresponding analytical and physical elements such that a modification to one element can be applied to modify a corresponding other. An error is automatically detected in the analytical representation.

24 Claims, 21 Drawing Sheets

U.S. PATENT DOCUMENTS

| | | | |
|---|---|---|---|
| 2003/0229478 A1 | 12/2003 | Rappaport et al. | |
| 2004/0122635 A1* | 6/2004 | Uraki | 703/2 |
| 2004/0145614 A1* | 7/2004 | Takagaki et al. | 345/964 |
| 2004/0153824 A1 | 8/2004 | Devarajan et al. | |
| 2004/0239494 A1 | 12/2004 | Kennedy et al. | |
| 2005/0038636 A1 | 2/2005 | Wakelam et al. | |
| 2005/0071394 A1 | 3/2005 | Martyn et al. | |
| 2005/0131924 A1 | 6/2005 | Jones | |
| 2005/0209831 A1 | 9/2005 | Jungreis et al. | |
| 2006/0119601 A1 | 6/2006 | Finlayson et al. | |
| 2006/0143220 A1 | 6/2006 | Spencer | |
| 2006/0208169 A1 | 9/2006 | Breed et al. | |
| 2006/0230351 A1 | 10/2006 | Stehle et al. | |
| 2007/0063378 A1 | 3/2007 | O'Donoghue | |
| 2007/0091119 A1 | 4/2007 | Jezyk et al. | |
| 2007/0174026 A1 | 7/2007 | Mangon et al. | |
| 2007/0174027 A1 | 7/2007 | Moiseyev | |
| 2007/0179759 A1 | 8/2007 | Mangon | |
| 2007/0179976 A1 | 8/2007 | Arvin et al. | |
| 2007/0219764 A1 | 9/2007 | Backe | |
| 2007/0282792 A1 | 12/2007 | Bailly et al. | |
| 2007/0285424 A1* | 12/2007 | Cheng et al. | 345/427 |
| 2008/0077364 A1 | 3/2008 | Wakelam et al. | |
| 2008/0243269 A1 | 10/2008 | Townsend et al. | |

FOREIGN PATENT DOCUMENTS

| | | |
|---|---|---|
| WO | WO 02/08975 | 1/2002 |
| WO | WO 03/100555 | 12/2003 |

OTHER PUBLICATIONS

Autodesk, Inc., International Search Report and the Written Opinion of the International Searching Authority dated Aug. 31, 2007 for International Patent Application No. PCT/US2007/064009 filed Mar. 14, 2007.

U.S. Appl. No. 11/619,565, filed Jan. 3, 2007, Kfouri et al.

European Patent Office Examination Report for EP Application No. 07 758 552.9-2224, dated Sep. 17, 2009, 8 pages.

Office Action dated Dec. 24, 2008 for U.S. Appl. No. 11/341,229, 20 pages.

Office Action dated May 14, 2009 for U.S. Appl. No. 11/341,229, 23 pages.

Parametric Technology Corporation, "Getting Started with Pro/Engineer(R) 2001," 2001, Parametric Technology Corporation, pp. 1-192.

Autodesk Inc., "AutoCAD Architectural Desktop (tm) User's Guide," 1999, Autodesk Inc., Release 2, pp. 1-xxiv; 1-8; 219-296.

Ramon F. Sarraga, "Modifying CAD/CAM surfaces according to displacements prescribed at a finite set of points," Computer-Aided Design vol. 36, Issue 4, Feb. 2004, pp. 343-349.

H.N. Gürsoy, "Tetrahedral Finite Elemente Mesh Generation from NURBS Solid Models," Engineering with Computers (1996), (12), pp. 211-223.

International Search Report for PCT Application No. PCT/US08/58746, dated Aug. 15, 2008.

"Autodesk Revit Building 8.1 User Guide," Aug. 2005, AutoDesk, Inc. http://images.autodesk.com/adsk/files/Autodesk_Revit_Building_8.1_Help.pdf.

International Preliminary Report on Patentability for PCT Application No. PCT/US2007/064009, dated Sep. 16, 2008, 13, pages.

Kim, J., et al., "Designing bar-mesh modules of reinforced concrete structures." © 1998 Elsevier Science Ltd., pp. 319-337.

* cited by examiner

| Family: | W-Wide Flange | | Load... |
|---|---|---|---|
| Type: | W12X26 | | Edit / New... |

Type Parameters: Control all elements of this type ─── 1102

| Parameter | Value |
|---|---|
| Structural | |
| A | 0.05 SF |
| W | 26.000000 |
| Dimensions | |
| bf | 0' 6 1/2" |

Instance Parameters - Control selected or to-be-created instance ─── 1104

| Parameter | Value |
|---|---|
| Structural Analysis | |
| Start Release  1106 | User Defined |
| Start Fx | ☐ |
| Start Fy | ☐ |
| Start Fz | ☐ |
| Start Mx ─── 1114 | ☑ ─── 1108 |
| Start My | ☐ |
| Start Mz | ☐ |
| End Release  1110 | User Defined |
| End Fx | ☑ |
| End Fy | ☑ |
| End Fz ─── 1112 | ☑ |
| End Mx | ☑ |
| End My | ☑ |
| End Mz | ☑ |
| Analytical Projection Plane | Level 2 |

ANALYSIS ERROR DETECTION FOR A CAD MODEL

BACKGROUND

Computer aided design (CAD) software tools are often used to prepare a CAD model or models representing a structure, such as a building. A CAD model can include a physical model, i.e., representations of physical elements, such as columns, beams, and the like that will be included in the structure. Drawings prepared from such a CAD model can be used in the actual physical construction of the corresponding structure. The CAD model may be prepared and edited by various individuals, including architects and structural engineers. As part of a design stage, a structural analysis is typically performed on components that will be included in the structure, for example, to ensure that there is sufficient load bearing capacity.

Structural analysis software is available to facilitate an analysis phase of a project. Conventional structural analysis software receives as input an analytical representation of a structure. An analytical representation of a structure is different than a representation of the physical elements, e.g., columns, beams, etc. It is an idealized mathematical model that may represent only a portion of a building such as one floor of a building. For example, an analytical representation may be a wire frame representation of the physical elements, and the wire frame elements can include or be associated with properties (e.g., weight, moment of inertia, cross-sectional area), member connectivity and/or end conditions (e.g., pinned, free, fixed). Typically, the analytical representation is prepared separately and is used for the structural analysis and perhaps other types of analyses that are performed in the design stage.

The analytical representation can be subjected to load simulation in a structural analysis program, for example, to identify stress levels in the various physical elements. On the basis of the analysis, analytical elements may be modified (e.g., resized or other properties changed) and the analytical representation reanalyzed in an iterative fashion. The results of the analysis can be used to update corresponding physical elements in the CAD model.

Analytical representations can be automatically generated from a CAD model. Users commonly simplify such analytical representations to reduce the amount of analytical noise generated in the analysis results. Sometimes users also manipulate the analytical representation to capture eccentricities such as a torque or turning not manifest in the physical model. These and other changes to an analytical representation can lead to errors in the analysis, however. For example, an analytical element in the analytical representation can be accidentally moved too far from a corresponding physical element in the CAD model. Other errors may be related to the CAD model itself. If a physical element's end conditions are not supported correctly, for instance, the analysis may be indeterminate and mathematically unsolvable.

For users to find out that an analytical representation is invalid they commonly are required to export an analytical representation of a CAD model to a structural analysis program. The nature of typical structural analysis methods is such that once an error has been discovered, the analysis terminates without producing meaningful results. Users must go back and remedy the problem in the analytical representation, export the analytical representation, and perform the analysis again. Sometimes an analysis may run for a long time before another error in the analytical representation is discovered. This frustrating, time consuming process can be repeated many times.

SUMMARY

In general, in one aspect, embodiments of the invention feature identifying an analytical representation of a plurality of physical elements in a computer aided design (CAD) model, the analytical representation comprising a plurality of analytical elements. One or more of the plurality of analytical elements correspond to one or more of the plurality physical elements. An association is identified between corresponding analytical and physical elements such that a modification to one element can be applied to modify a corresponding other. An error is automatically detected in the analytical representation.

These and other embodiments can optionally include one or more of the following features. Automatically detecting an error based on a comparison of an analytical element in the plurality of analytical elements to a corresponding physical element in the plurality of physical elements. Notifying a user of an error through a user interface. The detecting can be in response to user input modifying the CAD model or the analytical representation. Detecting can also be in response to the identification of an association between corresponding analytical and physical elements. An error is one of: a support distance error, an analytical element to a physical element distance error, an analytical adjustment distance error, a circular reference error, a zero member volume error, or a release condition error. A structural analysis of the analytical representation can be performed. User input can be received to modify a physical element or an analytical element; and modify a corresponding other to reflect the first modification. An error can be caused by a user moving an analytical element away from a corresponding physical element.

In general, in another aspect, embodiments of the invention feature identifying an analytical representation of a plurality of physical elements in a computer aided design (CAD) model, the analytical representation comprising a plurality of analytical elements. One or more of the plurality of analytical elements correspond to one or more of the plurality of physical elements. User input is received to modify a physical element in the plurality of physical elements or an analytical element in the plurality of analytical elements; and modify a corresponding other to reflect the first modification. In response to the user input, an error can be automatically detected in the analytical representation.

These and other embodiments can optionally include one or more of the following features. User input changes a location of an analytical element in the plurality of analytical elements or a physical element in the plurality of physical elements. Determining if the location of the moved element is within a distance tolerance. Determining if a circular reference exists in the analytical representation. Determining if an analytical element has zero length. And determining if instabilities exist in the analytical representation.

Particular embodiments of the invention can be implemented to realize one or more of the following advantages. A system and method are proposed that allow users to discover potential errors in an analytical representation before exporting the analytical representation to a structural analysis program. This can save users a great deal of time. Potential errors can be detected as they are introduced through user interaction with a CAD model. By comparing the physical model to an analytical representation of the physical model, potential errors can be quickly located and remedied. Suspected errors that can be evaluated may include an inconsistency in location between analytical and corresponding physical elements, a circular reference of a support structure, a zero volume element, a release condition instability, an analytical element to physical element adjustment condition, or a seemingly disconnected or improperly supported element. Checking for errors can occur on demand (i.e., at a user's discretion) or automatically as changes are made to the physical model or the analytical representation. Users may be alerted regarding the type of error and the location of the problem. The notification can take the form of, for example, a text message, a view of the CAD model or analytical representation with a close-up of the problem area, a separate report screen, or a pop-up and arrow to the offending element(s).

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

FIG. 11 is an illustration of a GUI for modifying properties of a physical beam element.

Like reference numbers and designations in the various drawings indicate like elements.

DETAILED DESCRIPTION

Figure 1:
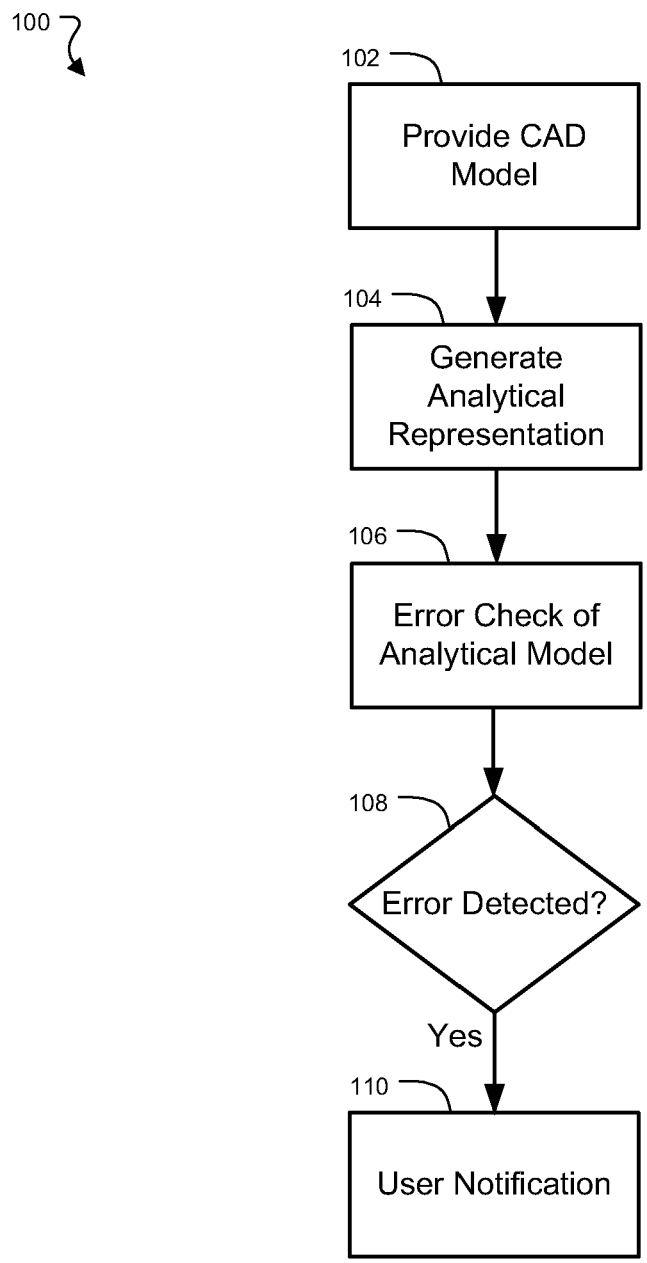
FIG. 1 is a flow diagram illustrating a technique for detecting errors in an analytical representation.

FIG. 1 is a flow diagram illustrating a technique 100 for detecting errors in an analytical representation. A CAD model is provided (step 102). The CAD model can be created, for instance, using a CAD tool or obtained from one or more files, object-oriented databases, relational databases, distributed objects, combinations of these, or other suitable storage. In one implementation, the CAD tool is Autodesk® Revit® Structure, available from Autodesk, Inc. of San Rafael, Calif. In one implementation, a CAD model includes one or more physical elements representing the elements of one or more physical structures, such as buildings. A physical element may represent a column, beam, floor, or wall, for instance. Properties can be associated with a physical element that detail the material composition of the element (e.g., length, width, manner of connectivity, materials), the element's physical location, and other suitable attributes.

An analytical representation is derived from the physical model (step 104) and can be incorporated into the CAD model. The analytical representation is an idealized mathematical model of a physical model and is used for analyzing the structural integrity of the physical model. An analytical representation of a CAD model includes one or more analytical elements. An analytical element can correspond to one or more physical elements in the CAD model, or no physical elements. Properties can be associated with analytical elements and can detail the structural properties of the physical elements (e.g., weight, moment of inertia, etc.), and other suitable information. In one implementation, the analytical representation is generated automatically when the CAD tool imports a physical CAD model, as a physical model is created or modified using a CAD tool, or when a user selects an option to generate an analytical representation of an existing physical model.

The analytical representation is checked for configurations that can cause errors during structure analysis (step 106). This step saves the time and effort of exporting the analytical representation to a structural analysis application to perform a potentially lengthy analysis just to learn that there is a flaw within the analytical representation or the physical model. By comparing the physical model to an analytical representation of the physical model, or by analyzing the analytical representation, potential errors can be quickly located and remedied. Suspected errors that are evaluated may include, but are not limited to, an inconsistency in location between analytical and corresponding physical elements, a circular reference of a support structure, a zero volume element, a release condition instability, an analytical element to physical element adjustment condition, or a seemingly disconnected or improperly supported element. Checking for errors can occur on demand (i.e., at a user's discretion) or automatically, for example, as changes are made to the physical model or the analytical representation. If potential errors are found within the physical model or the analytical representation (step 108), users may be alerted regarding the type of error and the location of the problem (step 110). The notification can take the form of, for example, a text message, a view of the CAD model or analytical representation with a close-up of the problem area, a separate report screen, or a pop-up and arrow to the offending element(s).

Figure 2:
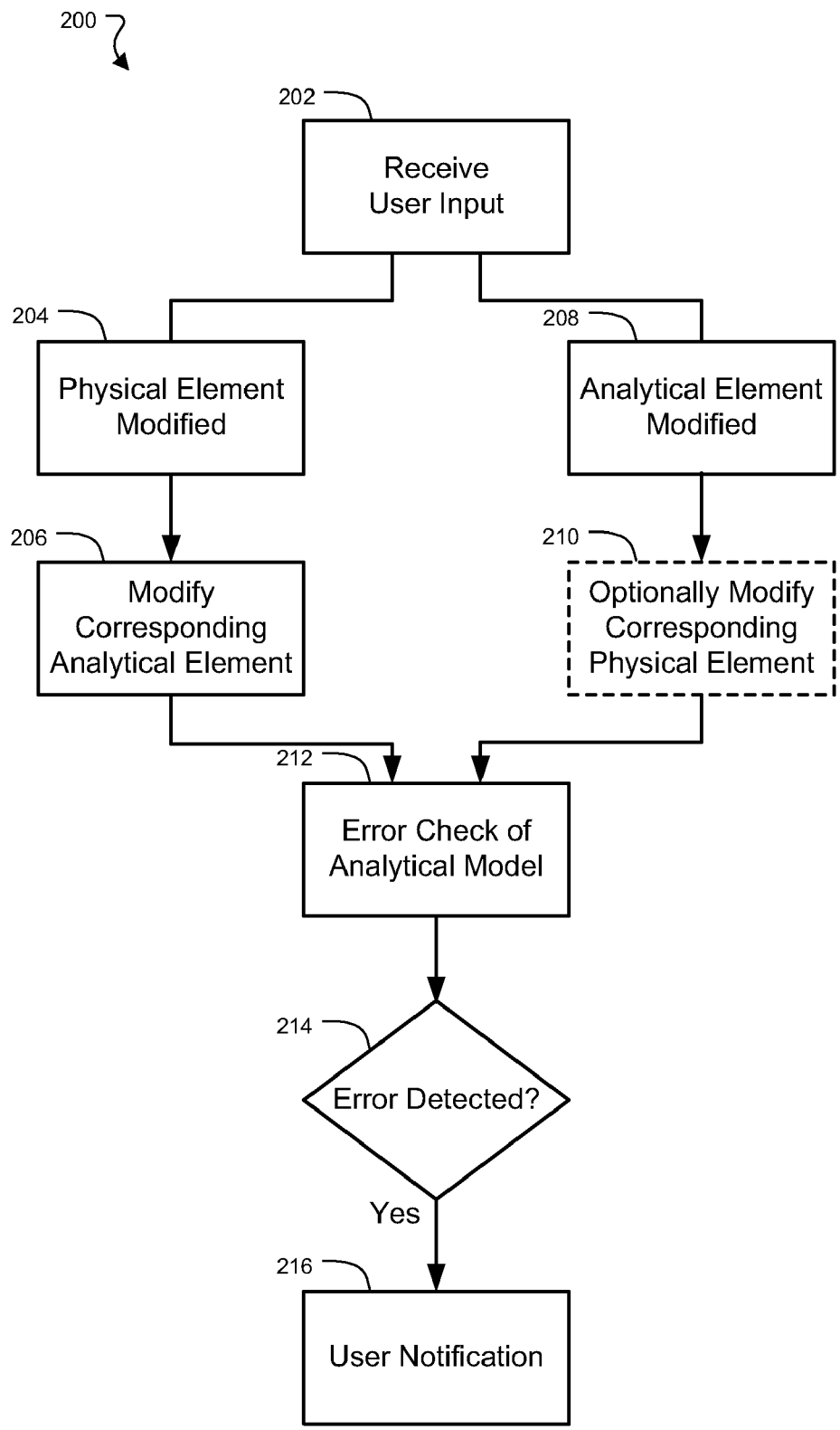
FIG. 2 is a flow diagram illustrating a technique for automatic error detection.

FIG. 2 is a flow diagram illustrating a technique 200 for automatic error detection. User input is received to modify an element in a physical model or an element in an analytical representation of the physical model (step 202). The user input can be of the form of an interaction with a user interface by means of a keyboard, a mouse, sounds, gestures, remote devices, manually controlled devices, brain waves, eye movement, and combinations of these. The modification can include adding, removing, relocating, or resizing an element. The user may also modify one or more of an element's properties, such as the weight of a beam. Alternatively, the user input can be provided programmatically by a process. If the user modifies a physical element (step 204), any necessary corresponding modification is automatically propagated to any associated analytical elements (step 206) such that synchronicity between the two representations is maintained. For example, if the physical element is shifted to a different location, the location of a corresponding analytical element (if any) will likewise be changed so that both elements occupy the same relative location in the respective models. In another example, if the physical element is widened, the weight and other properties of an associated analytical element (if any) are modified to mirror the changes to the physical element. Alternatively, if the user modifies an analytical element (step 208), the modification can optionally be propagated to one or more corresponding physical elements, if any (step 210).

An error check of the analytical representation is then performed (step 212). The error check allows for early detection of potential structural analysis problems before structural analysis is performed. Without error detection, by the time a potential problem is caught, the error messages may have compounded to the point of the initial problem being obscured. For example, a number of physical elements may be structurally dependent on an improperly supported physical element. Without early discovery, a large number of support errors can be generated by a structural analysis program. If a one or more errors are detected (step 214), a user notification is provided (step 216). In one implementation, the user is not required to correct the error since some inconsistencies or potential concerns may be anticipated or even desirable in an overall design. Instead, the user may choose to ignore, suppress or delete the notification rather than modify the analytical representation or the physical model.

Figure 3:
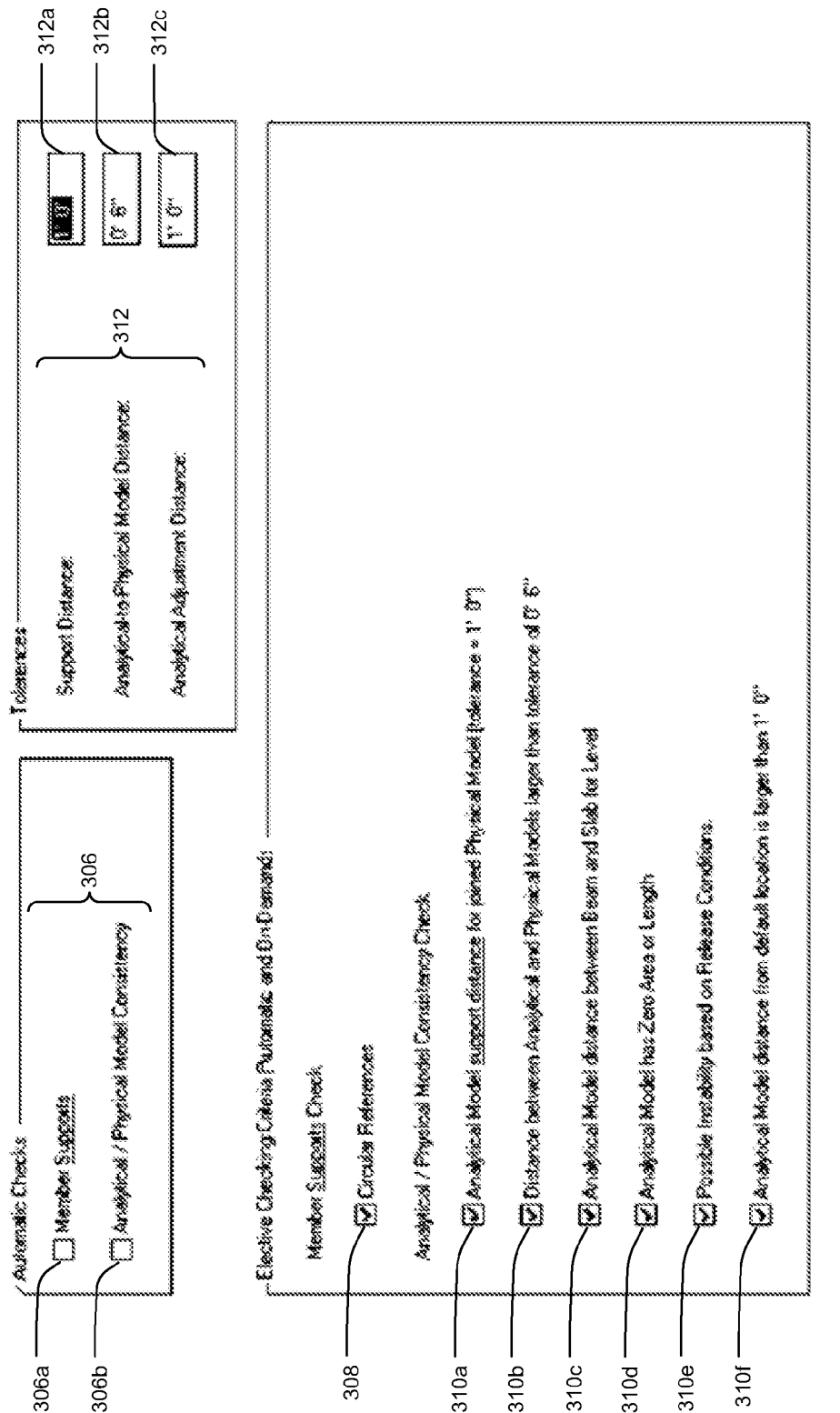
FIG. 3 illustrates a GUI for specifying error detection options for structural analysis error detection.

FIG. 3 illustrates one implementation of a graphical user interface (GUI) 300 for specifying error detection options for analysis error detection. An automatic checks area 306 of the GUI 300 allows users to specify whether automatic error checking will include member support checks or model consistency checks. User selection of checkbox 306a enables member support checks. User selection of checkbox 306b enables model consistency checks.

User selection of checkbox 308 enables checking for circular references in the analytical representation by automatically verifying, for example, whether or not one analytical element supports another analytical element in a circular fashion (e.g., without a solid base support).

User selection of checkbox 310a enables checking for support distance errors. Users can specify a support distance tolerance 312a, customizable within a set of tolerance values 312. The support distance tolerance 312a indicates how far an analytical element in the analytical representation may be located from another analytical element in the analytical representation in order to be considered connected to that element.

User selection of checkbox 310b enables checking for analytical element to physical element distance errors. If an analytical element is moved a distance greater than a tolerance distance from the analytical element's corresponding one or more physical elements (if any), an error is generated. Users can specify the tolerance distance by modifying the value of tolerance distance 312b.

User selection of checkbox 310c enables checking for distance errors related to how far an analytical beam element is from an analytical slab element on a given level. If an analytical element representing a beam is moved a distance greater than a tolerance distance from its corresponding analytical element representing a slab (or vice versa), an error is generated.

User selection of checkbox 310d enables checking for analytical elements that have zero area or zero length. An analytical element may empirically exist while no physical or analytical element appears in a visual rendering of the model because there is no size associated with the element. For example, a stray element which has a start point and an end point sharing the same location may be introduced when importing structural analysis results.

User selection of checkbox 310e enables checking for possible instabilities based on release conditions. An analytical model may contain structural instabilities based on estimated torque and lateral forces on one or more analytical elements, depending upon the manner in which it is connected to the surrounding elements.

User selection of checkbox 310f enables checking for errors related to the distance between an analytical element and a default location. The default location of the analytical element may be in the center of the physical beam or column element or along the planar surface of a slab element, for example. In one implementation, a user may choose to move an analytical element from its default location to allow the analytical elements of two abutting physical elements of different thicknesses to align properly. Users can specify an analytical adjustment distance by modifying the value of the adjustment distance 312c.

Figure 4:
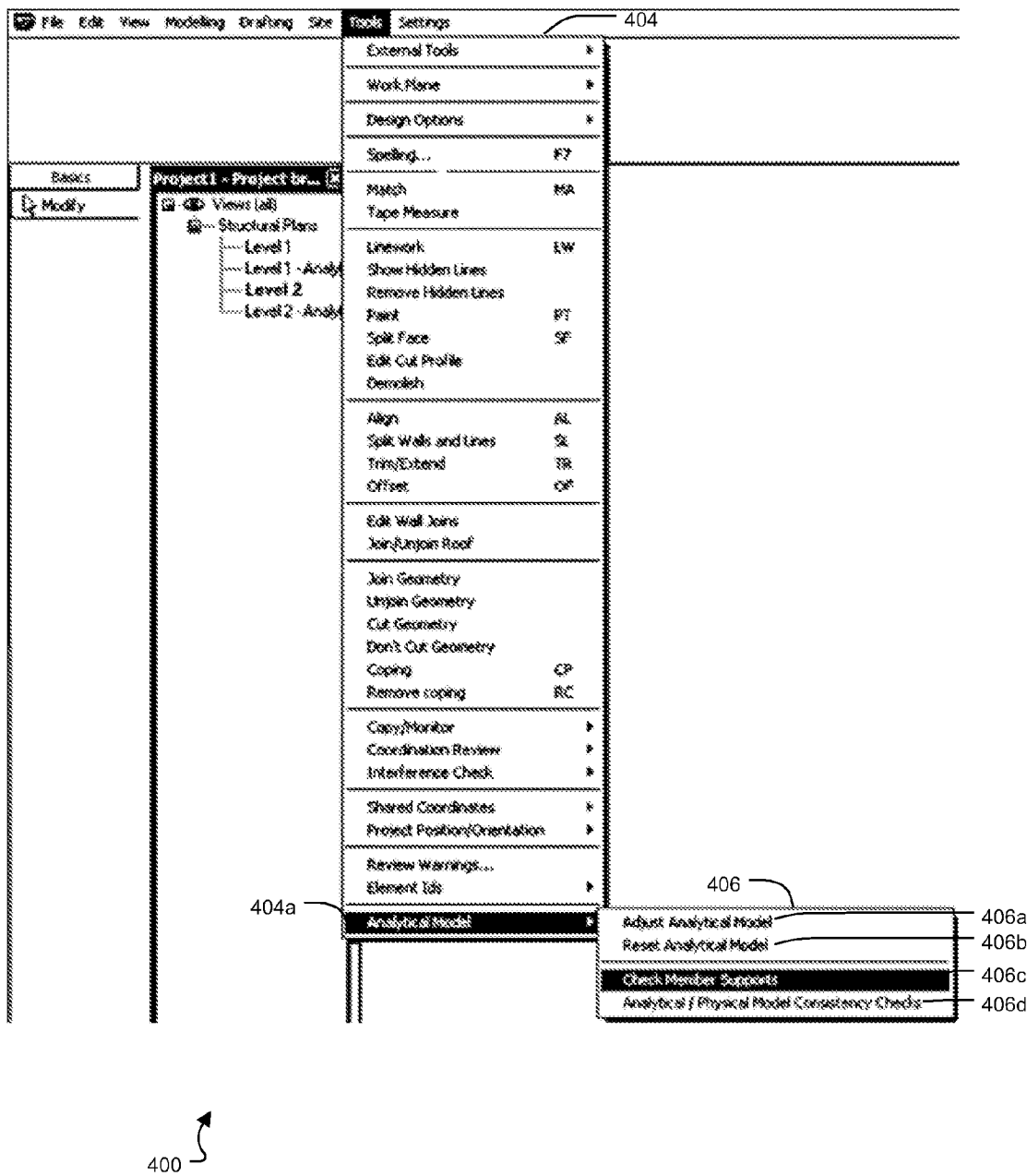
FIG. 4 illustrates a GUI for a CAD tool.

FIG. 4 illustrates one implementation of a GUI 400 for a CAD tool. The GUI 400 presents an analytical representation menu option 404a within a tools menu 404. The analytical representation menu option 404a contains a submenu 406. From the submenu 406, users may select to adjust an analytical representation (menu item 406a) which, when selected, causes the presentation of GUI 300. Alternatively, selection of menu item 406b which will cause the error detection options (see FIG. 3) to be reset to default values. Users may also select a menu item 406c which, when selected, manually activates the error detection functionality in relation to member support checking. This will verify whether or not there are any problems within the structural support of any of the elements within the analytical representation. For example, there can be verification that there are no circular support references within the analytical representation.

Selection of menu item 406d causes the manual activation of the analytical representation error detection functionality in relation to the synchronicity of the analytical and physical models. This will verify that there are no inconsistencies between the elements within the analytical representation and their corresponding elements within the physical model. An inconsistency may be due to an analytical element being in a different location than the corresponding physical element, for example.

Figure 5:
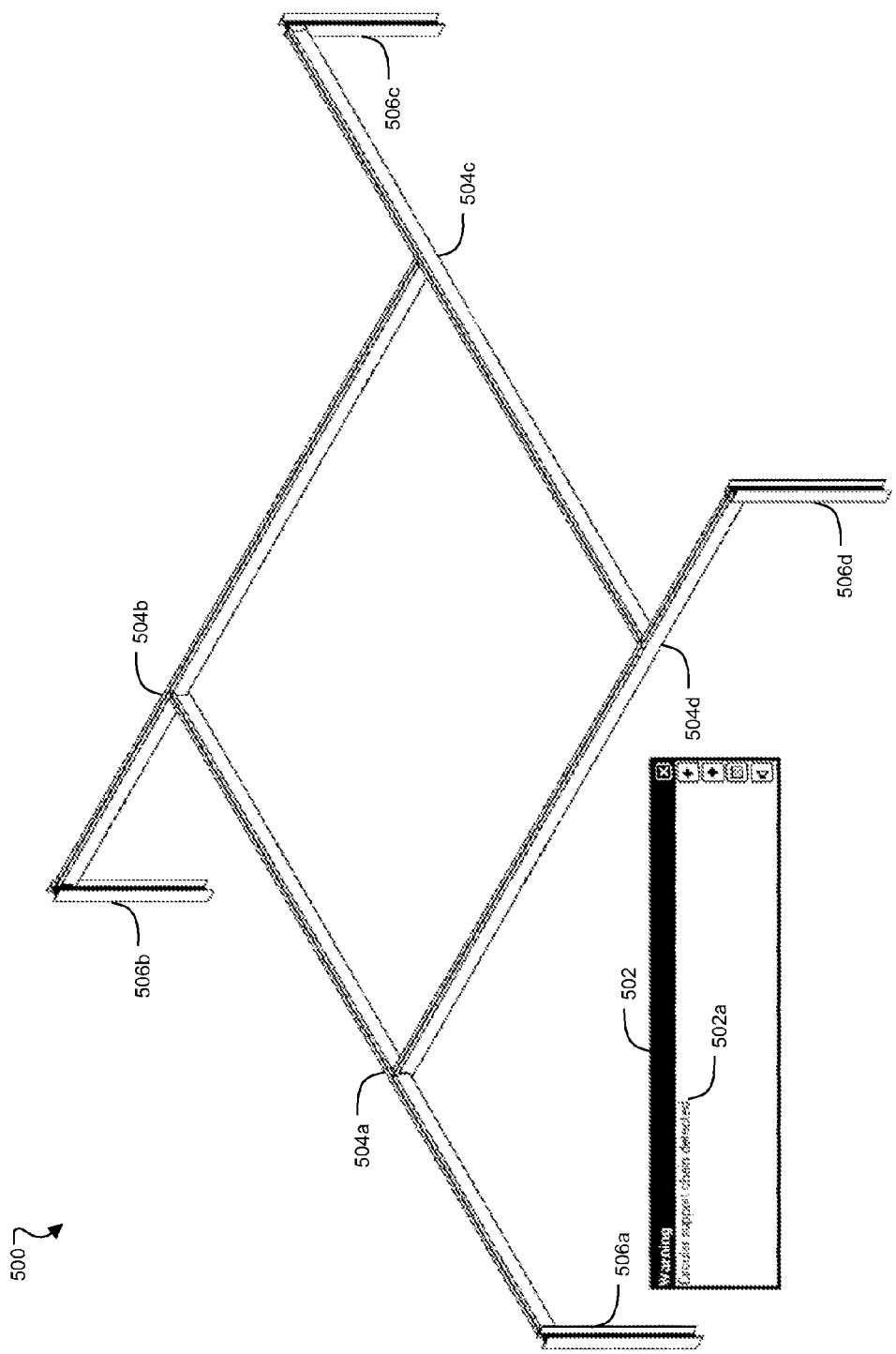
FIG. 5 is an illustration of an interactive view of a physical model exhibiting a circular support condition.

FIG. 5 is an illustration of an interactive view 500 of a physical model exhibiting a circular support condition, as might be presented in a CAD tool GUI. A circular support condition in a physical model can cause the same condition to be manifest in an analytical representation of the physical model. The view 500 shows physical beam elements (504a, 504b, 504c, and 504d) which have one end supported structurally from a level surface (506a, 506b, 506c, and 506d), and the other end of each beam is supported by the next beam, such that beam 504*b* supports beam 504*a*, beam 504*c* supports beam 504*b*, beam 504*d* supports beam 504*c*, and beam 504*a* supports beam 504*d*. A warning dialog box 502 alerts the user to this condition. An error message 502*a* within the warning dialog box 502 describes the condition. The user may select the error message 502*a* for more details. For example, selecting error message 502*a* may cause the generation of a new view of the analytical representation or physical model which highlights the source of the error.

Figure 6A:
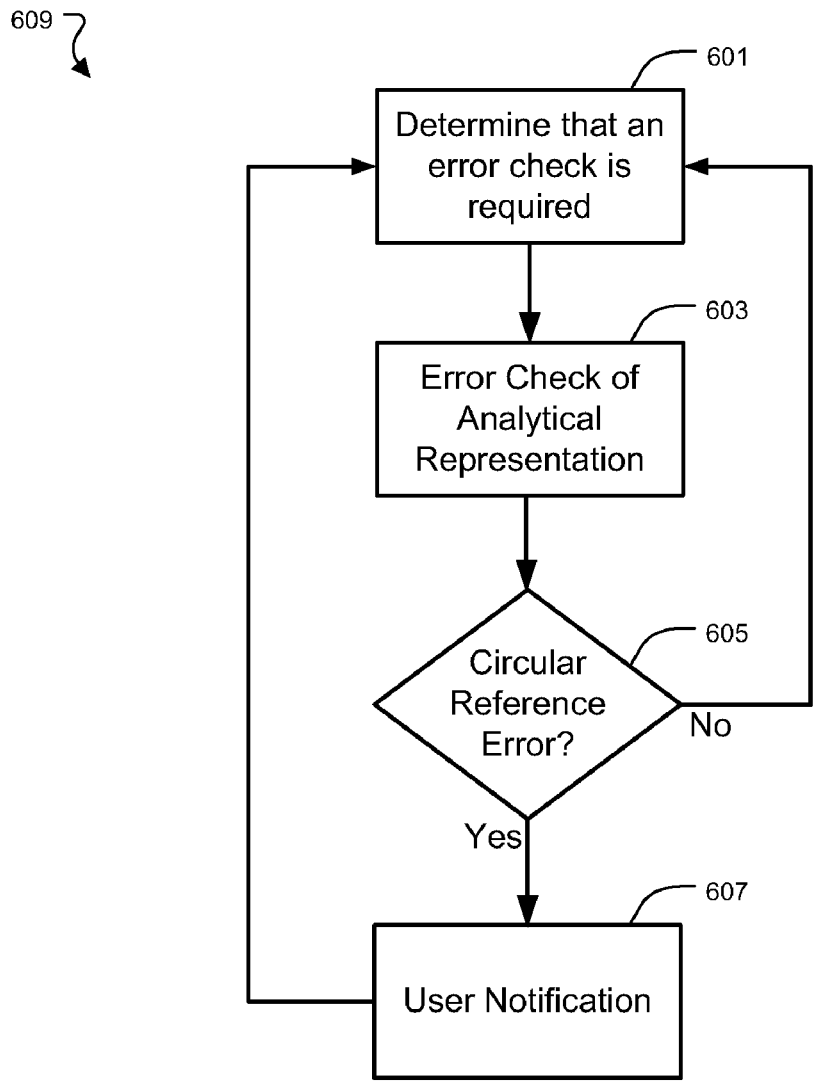
FIG. 6A is a flow diagram illustrating a technique for detecting circular support condition errors.

FIG. 6A is a flow diagram illustrating a technique 609 for detecting circular support condition errors. It is determined that an error check is required (step 601). For example, this determination can be made in response to a user importing a CAD model, a command from a user, or user modification of an element in the physical model or the analytical representation. An error check of the analytical representation ensues (step 603). In one implementation, the error analysis may check a particular view, one or more sub-structures of a CAD model, or an entire CAD model. The error checking algorithm can determine whether or not a circular reference error exists within the model. If one or more circular reference errors are identified (step 605), a user notification is generated (e.g., GUI 600; step 607). In one implementation, the user can be notified with a pop-up window or a zoomed-in highlighted version of the GUI, for example. In one implementation, the user notification individually lists all elements involved in the circular reference error. Whether or not a circular reference error has been identified, the technique will resume when it is again recognized that an error check is required (step 601).

Figure 6B:
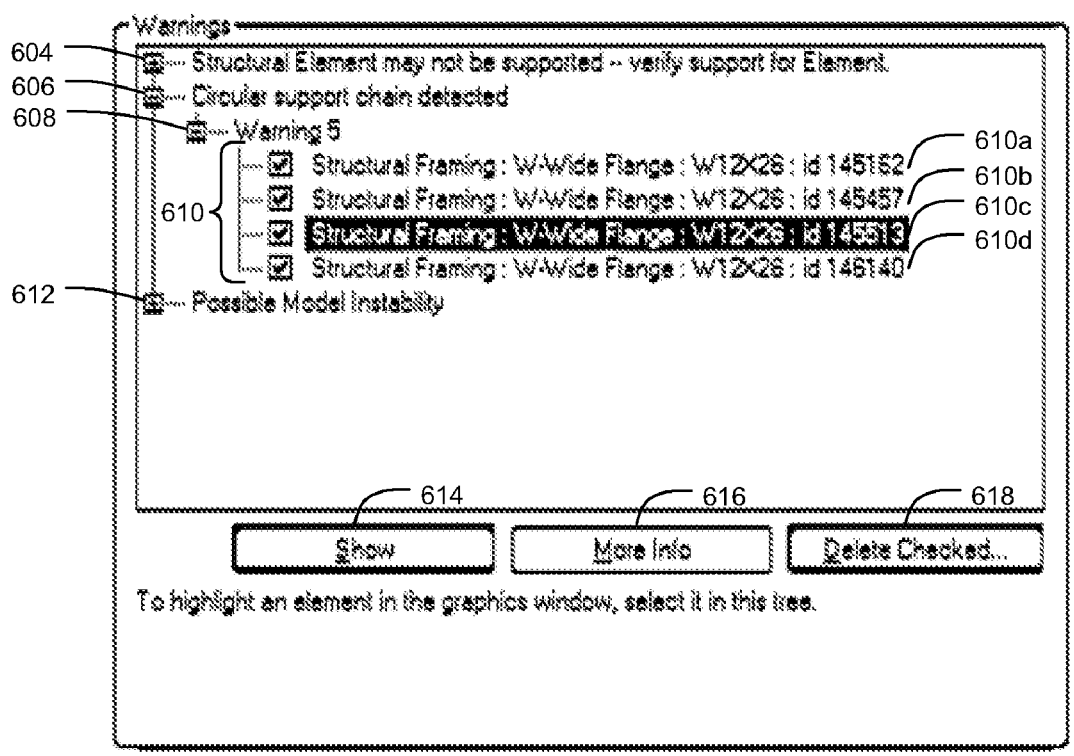
FIG. 6B is an illustration of a GUI for presenting potential circular support condition errors to users.

FIG. 6B is an illustration of a GUI 600 for presenting potential analysis errors to users. For example, errors from a circular support condition such as the one illustrated in FIG. 5 can be presented in the GUI 600. Users can select an expandable category 604 to cause presentation of a list of structural elements which may be lacking adequate structural support or the expandable category 612 to learn details of possible model instabilities. An expandable category 606 is shown in its expanded state along with its corresponding listing of circular support warnings, in this case warning 608. Warning 608 can be expanded by users to cause presentation of a list of implicated physical elements 610 comprising the circular support chain. Structural element 610*c* has been selected. A show button 614 will allow users to examine the problem where it arises in the physical model or analytical representation. In one implementation, the show button 614 will cause presentation of a view of the physical model or analytical representation wherein the source of the error is highlighted. A more info button 616 provides the user with additional information regarding the structural element 610*c*. For example, the positioning, weight, moment of inertia, and other characteristics of the structural element 610*c* may be provided via the more info button 616. A delete checked button 618 allows users to delete from the list of physical elements 610 those errors whose corresponding checkboxes (i.e., 610*a*, 610*b*, 610*c*, 610*d*) are selected. In this way, users can choose to ignore the warning.

Figure 7:
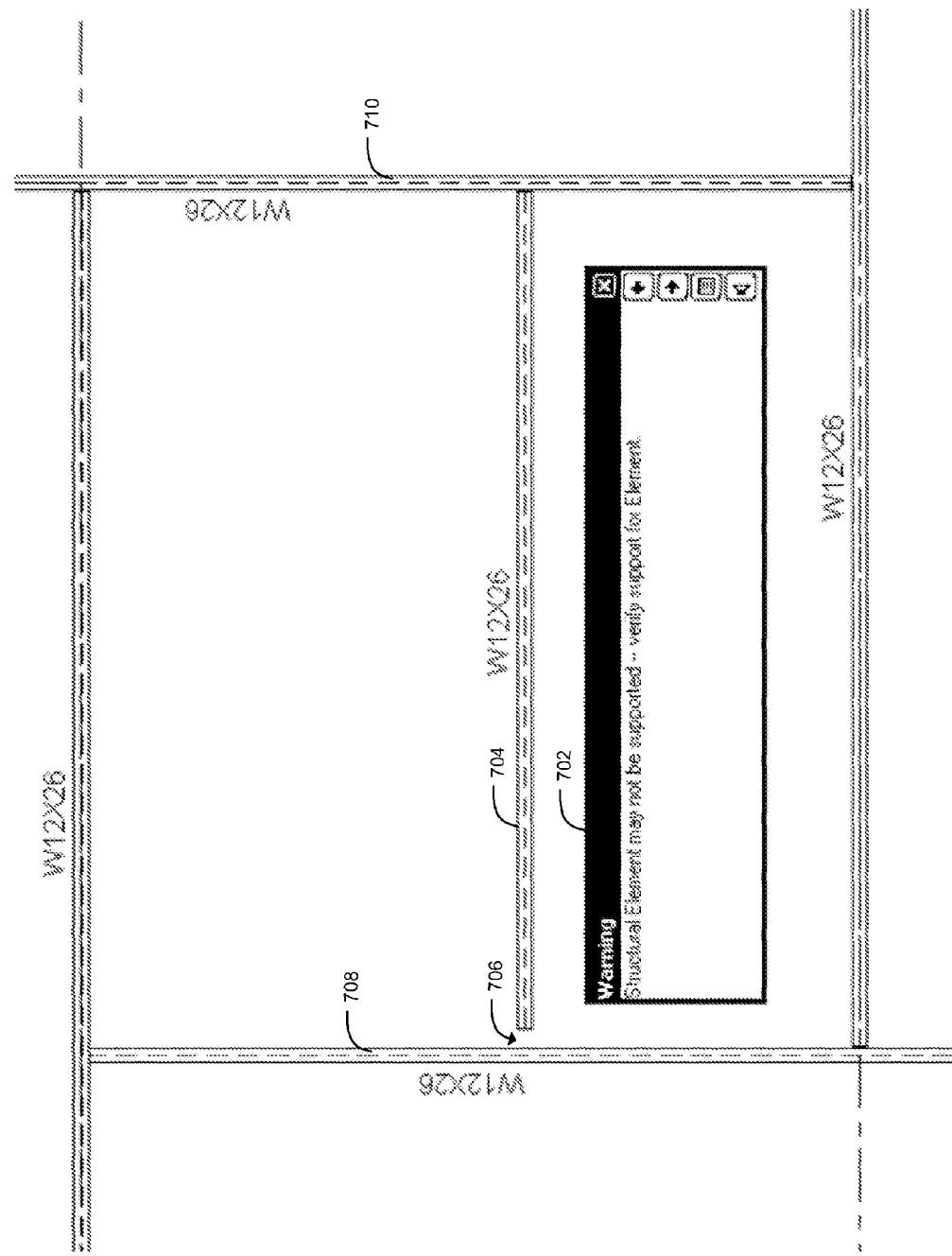
FIG. 7 is an illustration of an interactive view of a physical model exhibiting a support distance error condition.

FIG. 7 is an illustration of an interactive view 700 of a physical model exhibiting of a support distance error condition, as might be presented in a CAD tool GUI. The view 700 shows a beam 704 connected at one end to a perpendicular beam 710. The other end of the beam 704 is located near a perpendicular beam 708, but there is a gap 706 between the end of the beam 704 and the beam 708. If the gap 706 were within a tolerance zone setting, the CAD tool may assume that the user had meant for the beam 708 to support the beam 704. However, for this example there is no such tolerance setting or the gap 706 is greater than the tolerance value. A warning dialog 702 alerts the user that a structural element may not be supported.

Figure 8A:
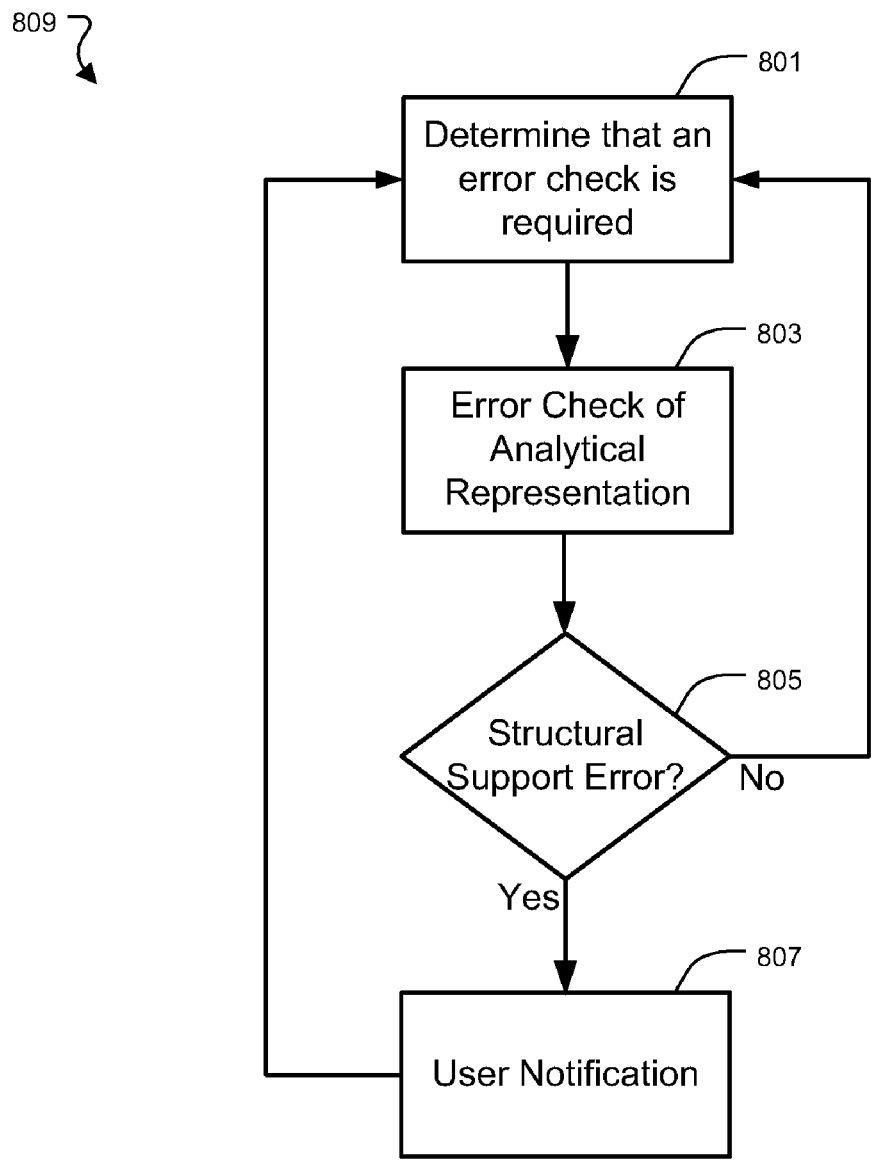
FIG. 8A is a flow diagram illustrating a technique for detecting support distance errors.

FIG. 8A is a flow diagram illustrating a technique 809 for detecting support distance errors. It is determined that an error check is required (step 801). For example, this determination can be made in response to a user importing a CAD model, a command from a user, or user modification of an element in the physical model or the analytical representation. An error check of the analytical representation ensues (step 803). In one implementation, the error analysis may check a single element within a CAD model, a particular view of a CAD model, one or more sub-structures within a CAD model, or an entire CAD model. The error checking algorithm can determine whether or not a support distance error exists within the model. If one or more support distance errors are identified (step 805), a user notification is generated (e.g., GUI 800; step 807). In one implementation, the user can be notified with a pop-up window or a zoomed-in highlighted version of the GUI, for example. In one implementation, the user notification individually lists all elements exhibiting a support distance error. Whether or not a support distance error has been identified, the technique will resume when it is again recognized that an error check is required (step 801).

Figure 8B:
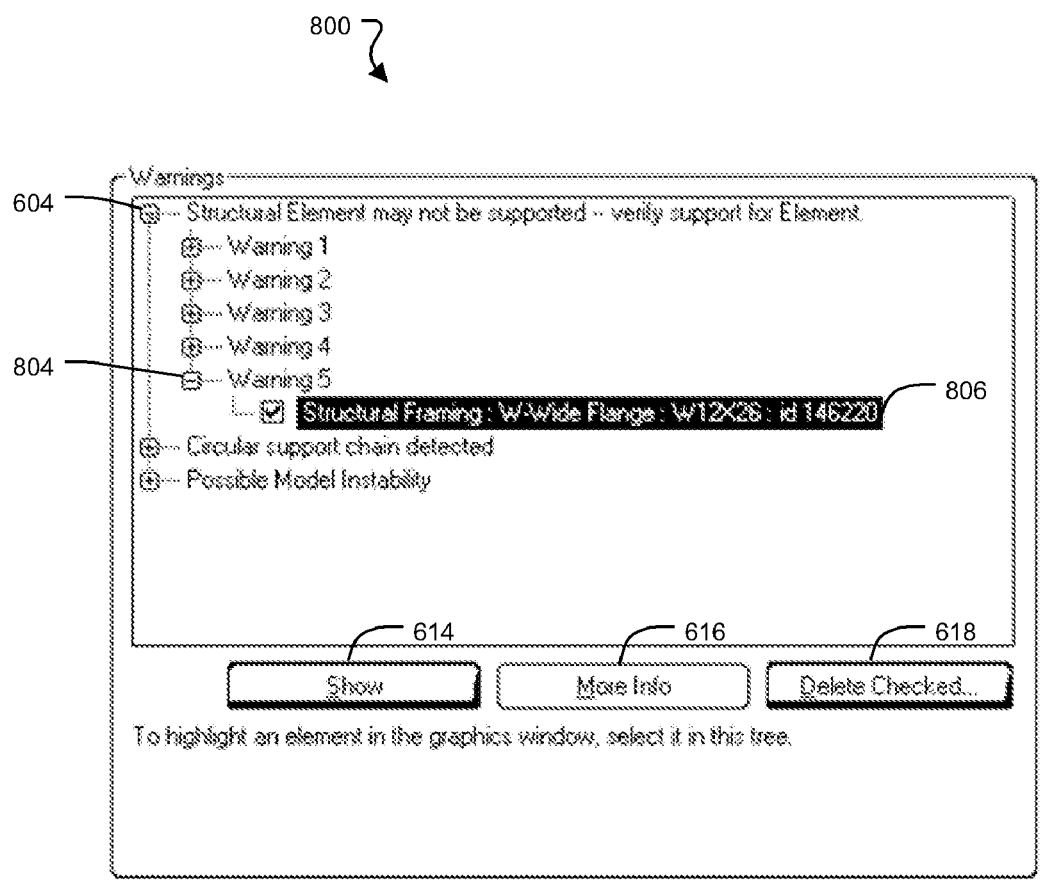
FIG. 8B is an illustration of a GUI for presenting support distance errors to users.

FIG. 8B is an illustration of a GUI 800 for presenting potential structural support problems to users. For example, errors from a support distance condition such as the one illustrated in FIG. 7 may be detailed within the GUI 800. The expandable category 604 is shown expanded along with a corresponding list of warnings involving structural elements which may be lacking structural support. Within the expandable category 604, an expandable category element 804 has been opened, exposing a checkbox 806 regarding a particular analytical element. The show button 614, more info button 616, and delete checked button 618 function as described in FIG. 6.

Figure 9:
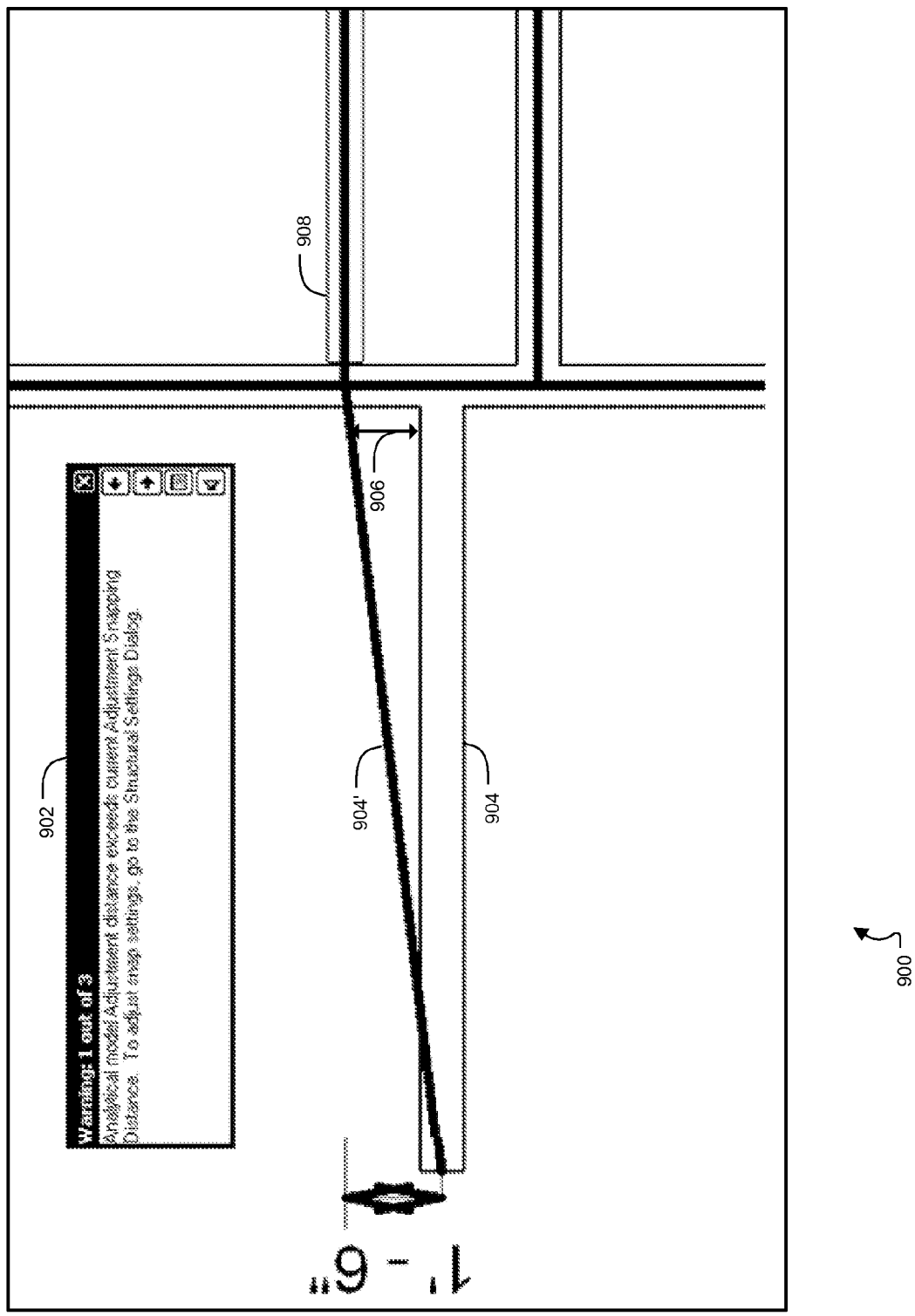
FIG. 9 is an illustration of an interactive view of a combined analytical model and physical model exhibiting an adjustment distance error.

FIG. 9 is an illustration of an interactive view 900 of a combined physical model and analytical representation exhibiting an adjustment distance error. An adjustment distance error occurs, for instance, when an analytical element is moved away from the analytical element's corresponding one or more physical elements such that the analytical element is no longer considered collocated with the corresponding physical elements. For example, the distance 906 between an analytical element 904' and a corresponding physical element 904 is greater than a margin of tolerance in which the two elements be considered collocated. This situation can have been created by moving the physical element 904 from being directly aligned with the physical element 908 to its present location. A warning dialog box 902 alerts users to this fact. In one implementation, the user is further told how to adjust settings in the CAD tool to modify the margin of tolerance. The warning 902 can be presented to users at the time the error is introduced in the analytical model, or at a later time when users decide to manually check for errors.

Figure 10A:
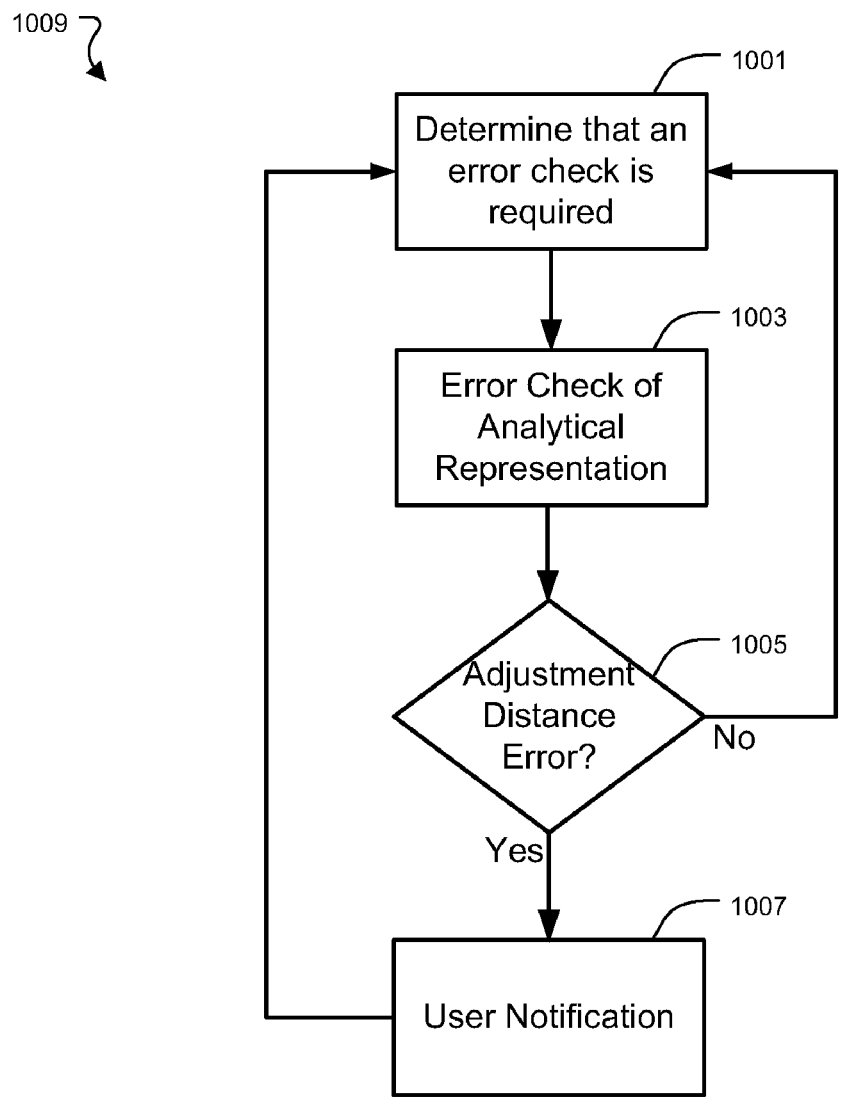
FIG. 10A is a flow diagram illustrating a technique for detecting adjustment distance errors.

FIG. 10A is a flow diagram illustrating a technique 1009 for detecting adjustment distance errors. It is determined that an error check is required (step 1001). For example, this determination can be made in response to a user importing a CAD model, a command from a user, or user modification of an element in the physical model or the analytical representation. An error check of the analytical representation ensues (step 1003). In one implementation, the error analysis may check a single element within a CAD model, a particular view of a CAD model, one or more sub-structures within a CAD model, or an entire CAD model. The error checking algorithm can determine whether or not an adjustment distance error exists within the model. If one or more adjustment distance errors are identified (step 1005), a user notification is generated (e.g., GUI 1000; step 1007). In one implementation, the user can be notified with a pop-up window or a zoomed-in highlighted version of the GUI, for example. In one implementation, the user notification individually lists all elements exhibiting an adjustment distance error. Whether or not an adjustment distance error has been identified, the technique will resume when it is again recognized that an error check is required (step 1001).

Figure 10B:
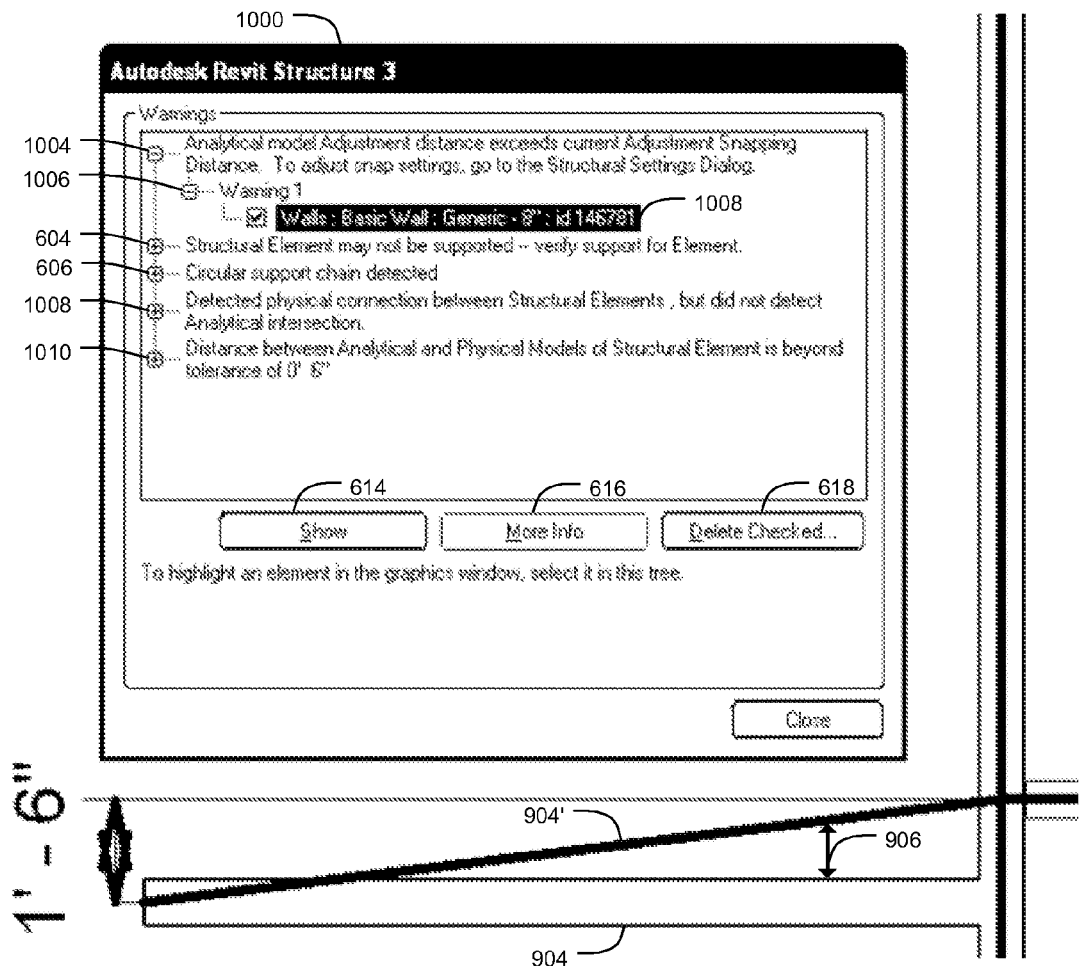
FIG. 10B is an illustration of a GUI for alerting users to adjustment distance errors.

FIG. 10B is an illustration of a GUI 1000 for alerting users to an adjustment distance error. For example, errors from an adjustment distance problem similar to the one found in FIG. 9 may be presented by GUI 1000. An expandable category 1004 contains a listing of warnings related to adjustment distance errors. An expandable category element 1006 within the expandable category 1004 contains a user-selectable walls checkbox 1008 which provides information regarding the problem element in question. The same problem can cause multiple errors to occur. For example, errors can also arise where physical connections exist between structural elements but no corresponding analytical elements exists (category 1008), and when analytical and physical element pairs have an unacceptable distance between their locations (category 1010). The show button 614, more info button 616, and delete checked button 618 function as described in FIG. 6.

FIG. 11 is an illustration of a GUI 1100 for modifying properties of a physical beam element. The beam's physical dimensions are provided in a type parameters section 1102 of the GUI 1100. In one implementation, type parameter values are propagated to all instances of a type. Beneath the type parameters section 1102 is an instance parameters section 1104. The instance parameters section 1104 describes the parameters for a particular beam instance.

The values provided in sections 1106 and 1110 each describe how an end of a physical beam element will connect to another physical element (i.e., release conditions). A set of checkboxes 1114 allows users to define lateral forces Fn and torques Mn in the x, y, and z direction for one end of the beam. In this illustration, checkbox 1108 has been selected signifying that the user has modified the connection to override the torque value along the x-axis. On the other end of the beam, connectivity is detailed similarly within a section 1110. Section 1110 contains a set of checkboxes 1112 pertaining to the lateral forces Fn and torques Mn in the x, y, and z directions. In this example, these checkboxes have all been selected indicating that the user will specify these values.

User modification of release conditions can result in release condition errors when a physical element's method of connection leaves it vulnerable to being twisted, pulled or otherwise moved out of position due to the forces applied to the physical element during structural analysis. In this case, a user may need to modify the release conditions to compensate for the forces upon the physical element in question.

Figure 12:
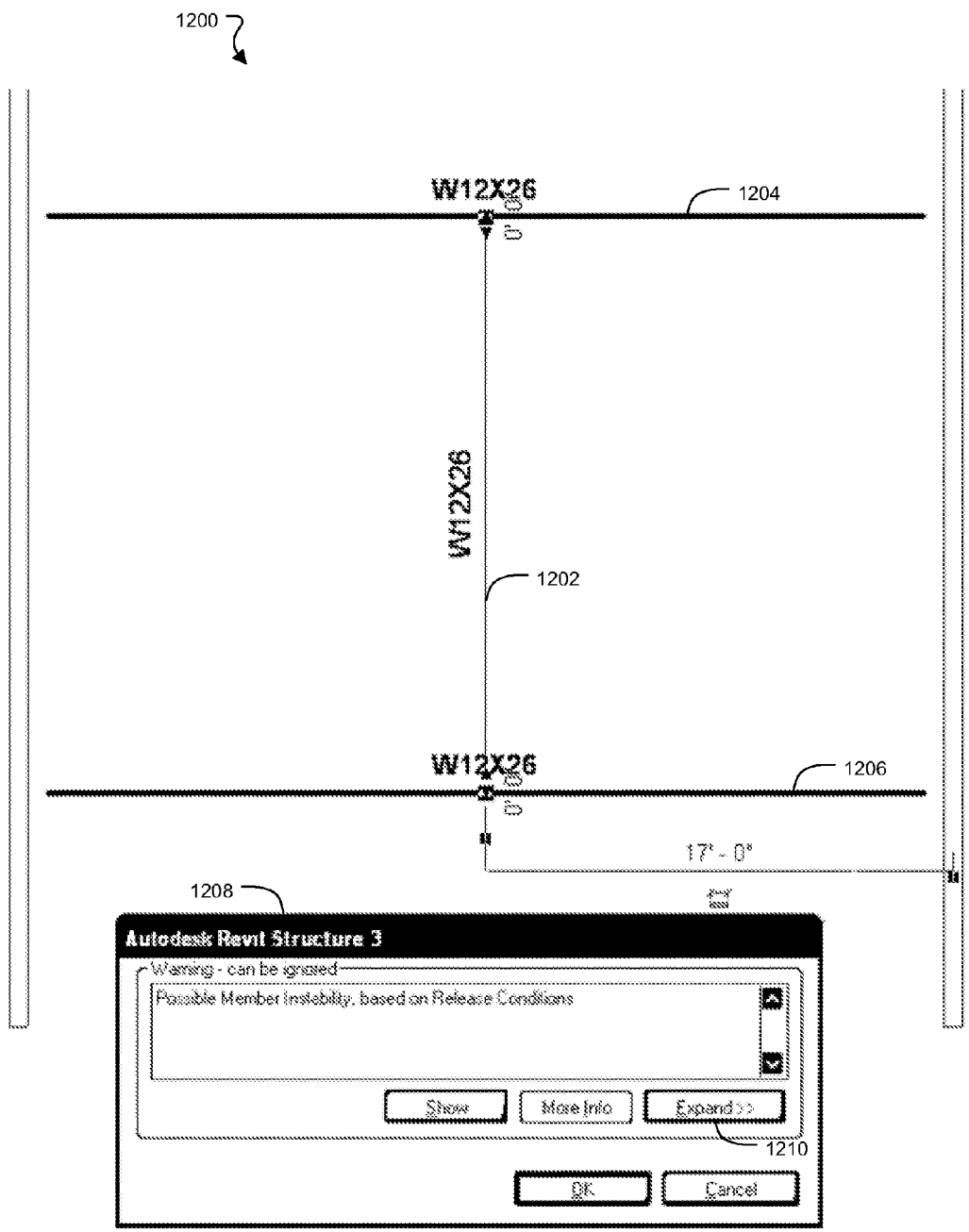
FIG. 12 is an illustration of an interactive view of a release condition error in an analytical representation.

FIG. 12 is an illustration of an interactive view 1200 of a release condition error within an analytical representation. A release condition error occurs when a physical element has an undesirable freedom of movement in regards to a corresponding analytical element's connection to other analytical elements in an analytical model. For example, a beam analytical element 1202 is attached between an upper beam analytical element 1204 and a lower beam analytical element 1206. A warning dialog box 1208 alerts the user to a potential instability for the beam analytical element 1202 because of a release condition error. For example, the beam element 1202 may be connected to the elements 1204 and 1208 in such a way that beam element 1202 is capable of rotating about its own axis. If the element 1202 were a part of a building, it would likely be undesirable for the element 1202 to be capable of such rotation. The user may select an expand button 1210 within the warning dialog box 1208 to view the error condition in greater detail, such as in GUI 1300 found in FIG. 13.

Figure 13A:
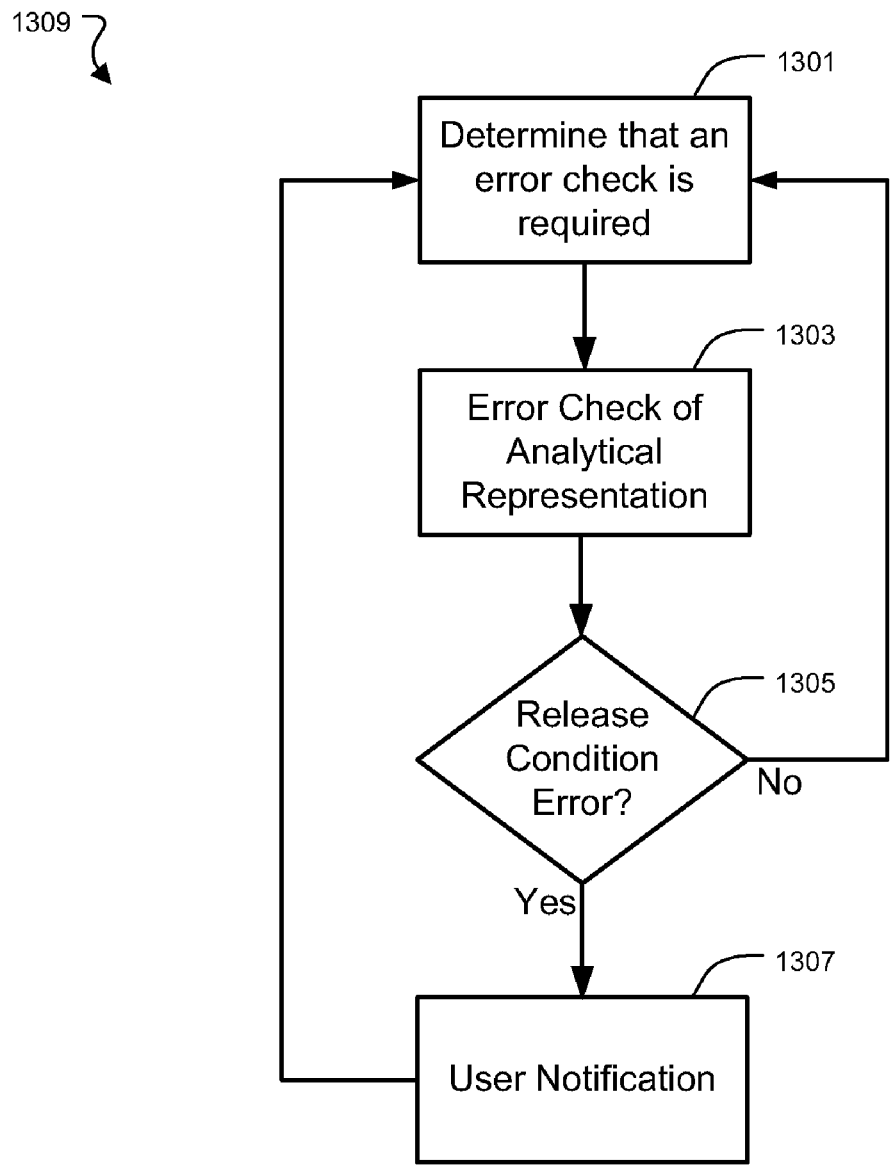
FIG. 13A is a flow diagram illustrating a technique for detecting release condition errors.

FIG. 13A is a flow diagram illustrating a technique 1309 for detecting release condition errors. It is determined that an error check is required (step 1301). For example, this determination can be made in response to a user importing a CAD model, a command from a user, or user modification of an element in the physical model or the analytical representation. An error check of the analytical representation ensues (step 1303). In one implementation, the error analysis may check a single element within a CAD model, a particular view of a CAD model, one or more sub-structures within a CAD model, or an entire CAD model. The error checking algorithm can determine whether or not a release condition error exists within the model. If one or more release condition errors are identified (step 1305), a user notification is generated (e.g., GUI 1300; step 1307). In one implementation, the user can be notified with a pop-up window or a zoomed-in highlighted version of the GUI, for example. In one implementation, the user notification individually lists all elements exhibiting a release condition error. Whether or not a release condition error has been identified, the technique will resume when it is again recognized that an error check is required (step 1301).

Figure 13B:
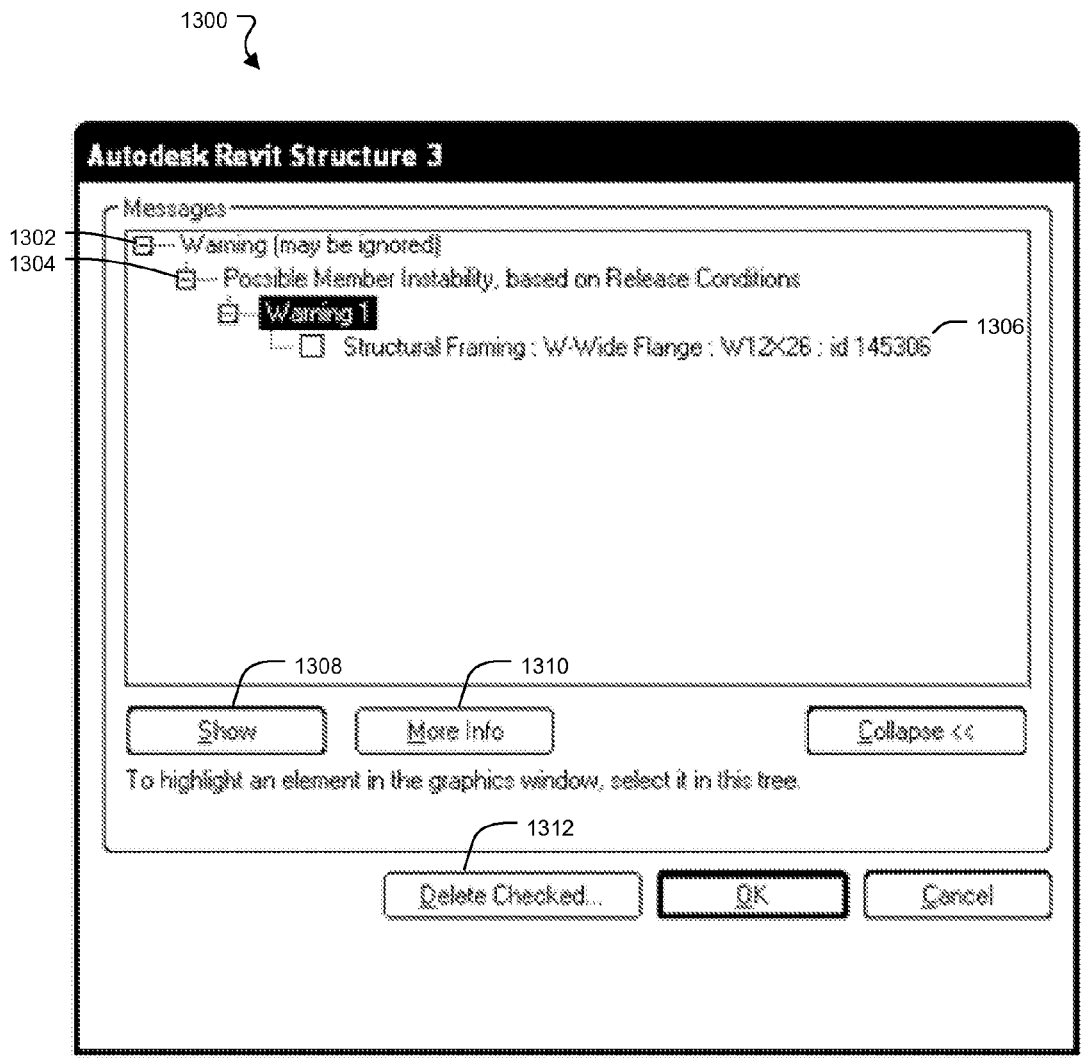
FIG. 13B is an illustration of a GUI for presenting details of a release condition errors to users.

FIG. 13B is an illustration of the GUI 1300 for presenting details of a release condition warning. An expandable category 1304 displays member instability warnings related to their release conditions. An element checkbox 1306 is included within the warnings. If the user selects the element checkbox 1306, a show button 1308 will cause a view of the analytical or physical model to be presented highlighting the problem element(s). With the checkbox 1306 selected, a user may also activate a more info button 1310 to retrieve a more detailed list of information regarding the element described within the checkbox 1306. These details may pertain to the element's end releases such as the information described within FIG. 11. With the checkbox 1306 checked, it is also possible for the user to select a delete checked button 1312, which will remove the warning from the list. The user may opt to delete the warning because the release condition behavior exhibited is not an issue in the present design.

Figure 14:
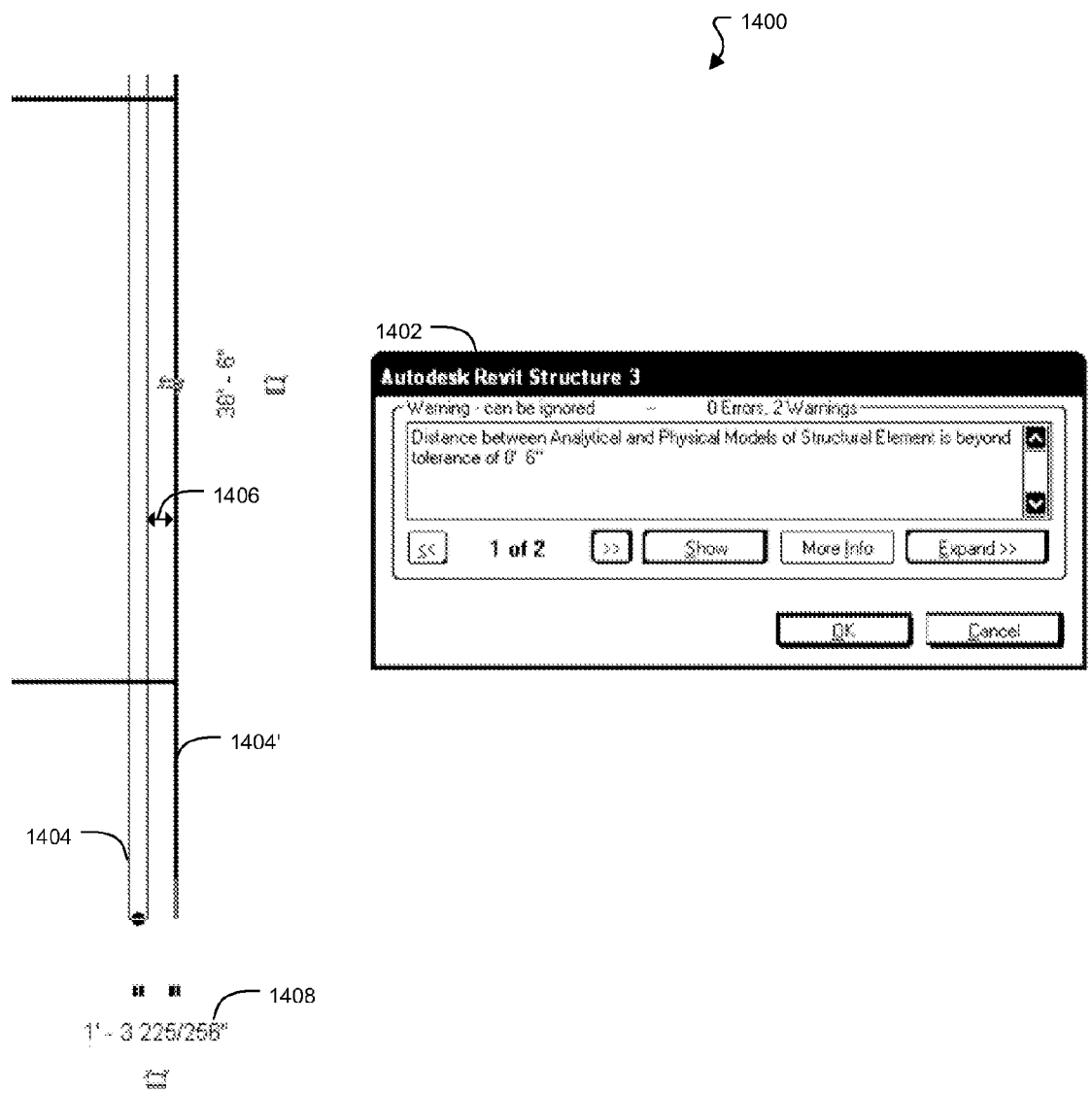
FIG. 14 is an illustration of an interactive view exhibiting an analytical to physical model distance error.

FIG. 14 is an illustration of an interactive view 1400 exhibiting an analytical to physical model distance problem. An analytical element 1404' and a corresponding physical element 1404 are separated by a gap 1406. The gap 1406 is of a distance 1408 of nearly one foot, four inches. A dialog box 1402 warns the user that the distance between a set of corresponding analytical and physical elements is greater than the default tolerance setting of six inches. For instance, the analytical element 1404' and the physical element 1404 may define a wall. The analytical element 1404', in this example, may have been moved at some point from its default position down the center of the physical element 1404, perhaps to allow it to align properly with another analytical element above or below it.

Figure 15A:
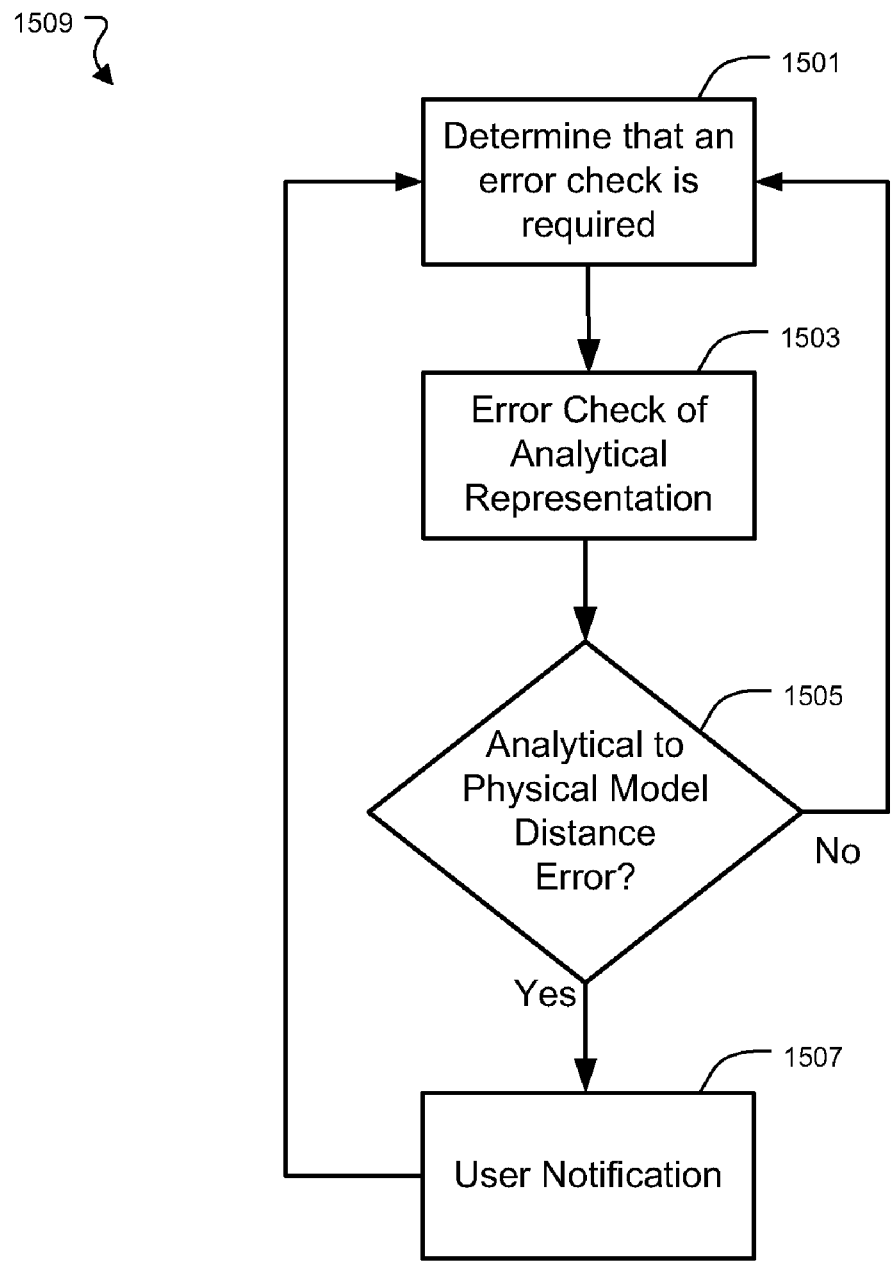
FIG. 15A a flow diagram illustrating a technique for detecting analytical to physical model distance errors.

FIG. 15A a flow diagram illustrating a technique 1509 for detecting analytical to physical model distance errors. It is determined that an error check is required (step 1501). For example, this determination can be made in response to a user importing a CAD model, a command from a user, or user modification of an element in the physical model or the analytical representation. An error check of the analytical representation ensues (step 1503). In one implementation, the error analysis may check a single element within a CAD model, a particular view of a CAD model, one or more sub-structures within a CAD model, or an entire CAD model. The error checking algorithm can determine whether or not an analytical to physical model distance error exists within the model. In one implementation, a tolerance distance may be used to determine whether or not the elements are to be considered placed within the same position. If one or more analytical to physical model distance errors are identified (step 1505), a user notification is generated (e.g., GUI 1500; step 1507). In one implementation, the user can be notified with a pop-up window or a zoomed-in highlighted version of the GUI, for example. In one implementation, the user notification individually lists all elements exhibiting an analytical to physical model distance error. Whether or not an analytical to physical model distance error has been identified, the technique will resume when it is again recognized that an error check is required (step 1501).

Figure 15B:
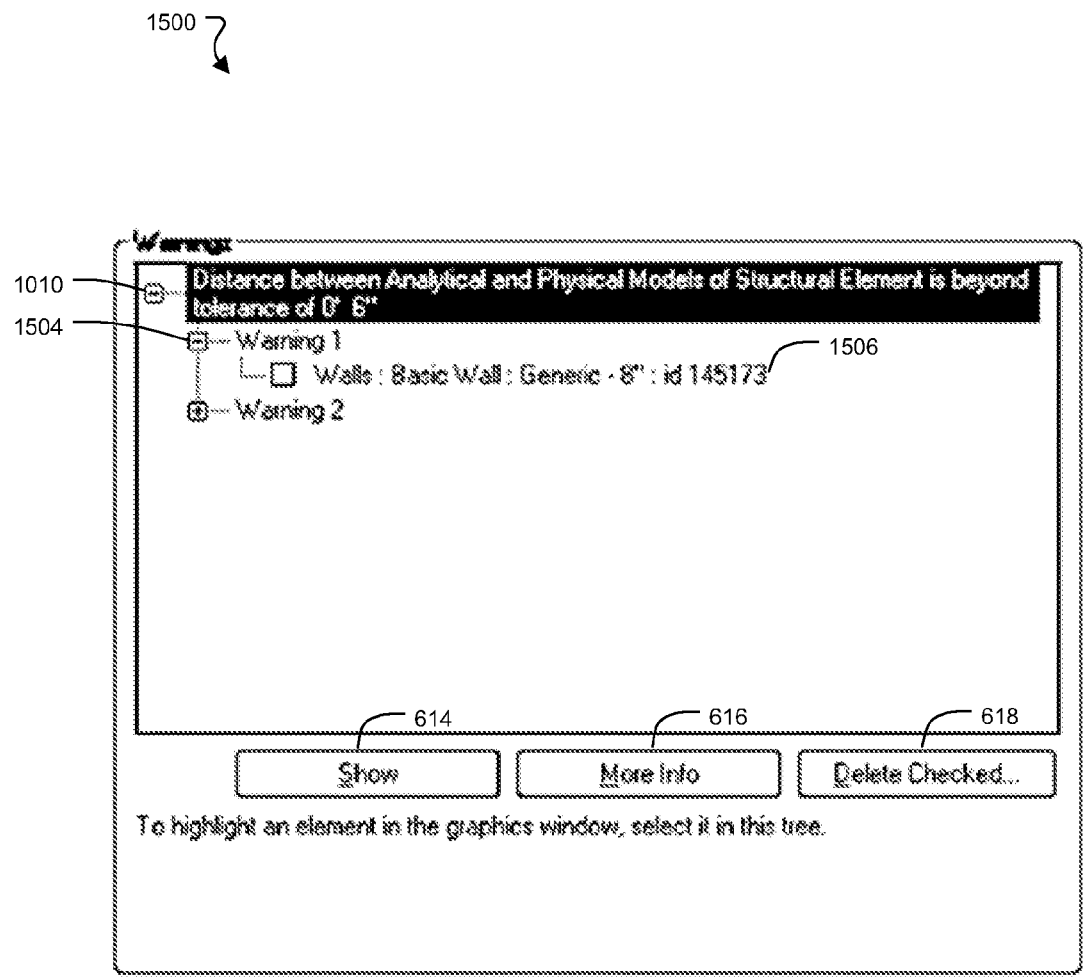
FIG. 15B an illustration of a GUI for displaying an analytical to physical model distance errors to users.

FIG. 15B is an illustration of a GUI 1500 for displaying an analytical to physical model distance error. The GUI 1500 contains an expandable category 1010 for viewing analytical to physical model distance warnings. Such a warning indicates that the distance between an analytical element and its one or more corresponding physical elements is greater than a tolerance setting. A user has selected an expandable category 1504 to view a specific error. Error 1506 relates to a wall element which is exhibiting an analytical to physical distance error. The show button 614, more info button 616, and delete checked button 618 function as described in FIG. 6.

Figure 16:
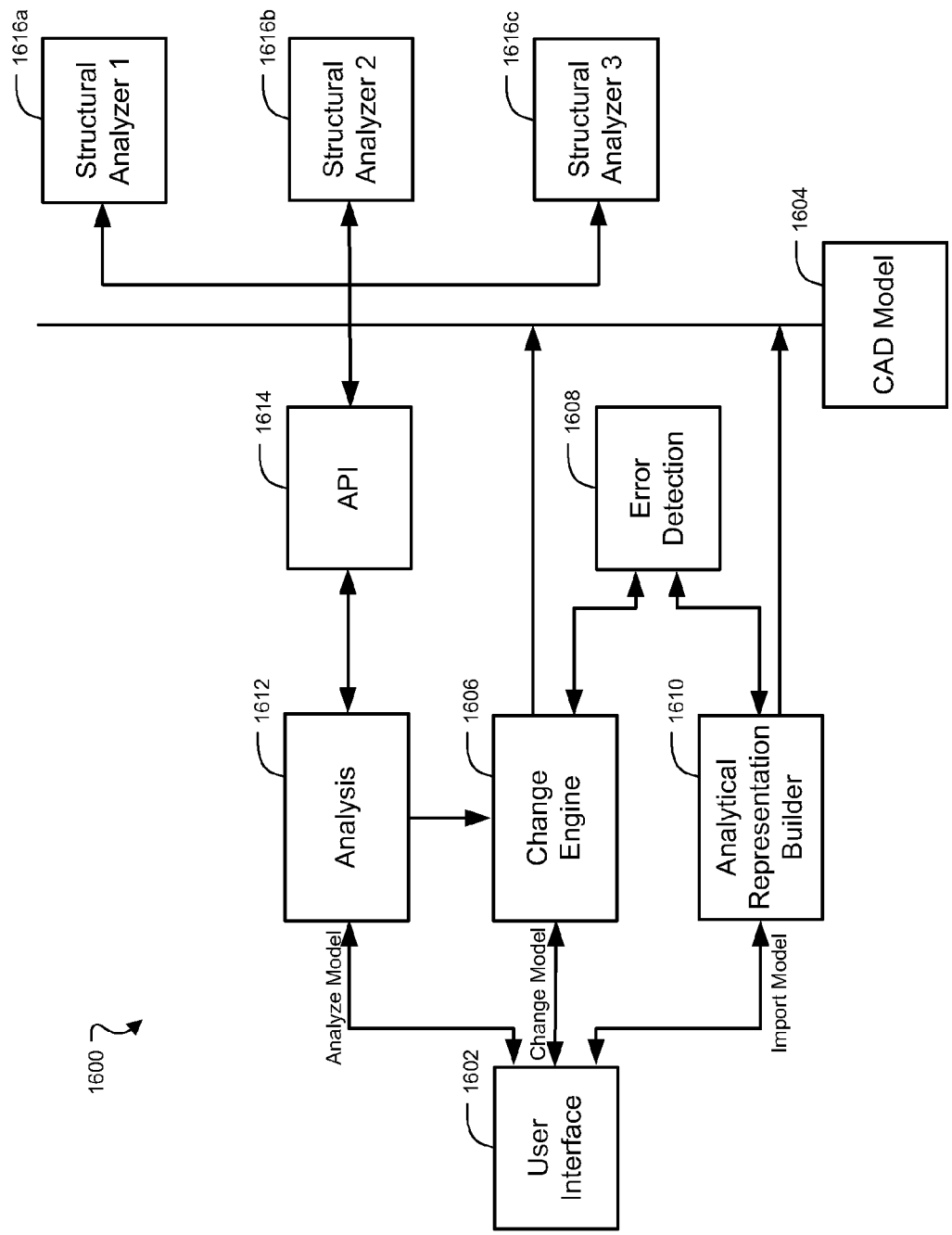
FIG. 16 illustrates a system diagram of a CAD tool with analysis error detection.

FIG. 16 illustrates a system diagram 1600 of a CAD tool with analysis error detection. Through a user interface 1602, a user may opt to create, modify or import a physical model 1604 or an analytical representation of the physical model 1604. An analytical representation builder 1610 can generate an analytical representation of the physical model 1604 if one does not exist. In addition the analytical representation builder 1610 can automatically reflect changes to the physical model 1604 in the analytical representation, as discussed above. In one implementation, the analytical representation is incorporated into the physical model 1604.

An error detection module 1608 performs structural analysis error checking of the analytical representation based on the analytical representation and the physical model 1604. An analytical representation is created so that a model may be analyzed for any problems with its structural integrity. The analytical elements comprising the analytical representation identify a physical element's material composition (e.g. weight, stress tolerance, etc.). This information may be exported into a structural analysis tool to validate a physical model's structural integrity. The error detection module 1608 attempts to verify the analytical representation's potential for being useful as input to a structural analysis application. If the error detection module 1608 detects a problem (either automatically or in response to a user request for error detection), a notification is propagated back to the user interface 1602 to inform the user of such.

When a user opts to modify the analytical representation or the physical model 1604, the user interface 1602 invokes a change engine 1606 to apply the corresponding change to the complementary element. For instance, if a physical element is added or modified, its coordinating analytical element (if any) will be created or adjusted accordingly via the change engine 1606 to synchronize the analytical representation and the physical model 1604. Conversely, if an analytical element is modified, its corresponding physical element(s) (if any) may also be updated via the change engine 1606. The error detection module 1608 can then be invoked to verify that there are no potential error conditions created because of the modification. If a potential error condition is detected, a warning can be propagated to the user interface 1602.

A user can select to analyze the existing physical model 1604. The user interface 1602 invokes an analysis module 1612. The analysis module 1612 exports the analytical representation of the CAD model 1604 to one or more structural analysis applications (i.e. 1616a, 1616b, or 1616c) via an Application Programming Interface (API) 1614 or other suitable mechanism. The API 1614 may cause the structural analysis program (1616a, 1616b, 1616c) to present a GUI to the user for interfacing with the analysis engine. The API may otherwise allow the structural analysis program (1616a, 1616b, 1616c) to directly write and/or read information to/from the CAD model 1604. The results of the structural analysis run by, for instance, structural analyzer 1616b, will be returned to the analysis module 1612 through the API 1614. These results may include suggested modifications of the physical and/or analytical elements of the CAD model 1604. For example, a beam's overall size may be increased to accommodate a load. The test results for individual elements may be stored within each element's properties. If the user has opted for automatic update, the changes made by the structural analyzer 1616b will be sent from the analysis module 1612 to the change engine 1606. The change engine 1606 will implement alterations to the physical and/or analytical elements and also synchronize the changes with their corresponding elements (physical or analytical) of the CAD model 1604. The change engine 1606 can then invoke the error detection module 1608 to determine whether the changes have incurred potential errors in the analytical representation of CAD model 1604. If a potential error is found, a warning message can be propagated to the user interface 1602.

The system 1600 may have fewer or more components than those illustrated in FIG. 16. A given component can execute on one or more communicably coupled computer devices. For instance, computing devices can be connected by a wired network, a wireless network, the Internet, shared memory, an inter-processor communication channel, or combinations of these.

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the invention, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understand as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. For example, the actions recited in the claims can be performed in a different order and still achieve desirable results.

What is claimed is:

1. A computer-implemented method, comprising:
   identifying an analytical representation of a plurality of physical elements in a computer aided design (CAD) model, the analytical representation comprising a plurality of wire frame elements associated with connectivity conditions, one or more of the plurality of analytical elements corresponding to one or more of the plurality physical elements;
   establishing an association between corresponding analytical and physical elements such that a modification to one element causes a modification to a corresponding other; and
   detecting an error when a distance between a wireframe element and a corresponding physical element is greater than a tolerance distance.

2. The computer-implemented method of claim 1, further comprising:
providing notification of the error through a user interface.

3. The computer-implemented method of claim 1 wherein detecting is in response to user input modifying the CAD model or the analytical representation.

4. The computer-implemented method of claim 1 wherein detecting is in response to the identification of an association between corresponding analytical and physical elements.

5. The computer-implemented method of claim 1 wherein the error is one of: a support distance error, an analytical element to a physical element distance error, or an analytical adjustment distance error.

6. The computer-implemented method of claim 1, further comprising performing a structural analysis of the analytical representation.

7. The computer-implemented method of claim 1, further comprising:
receiving user input modifying a physical element or an analytical element; and
modifying a corresponding other in response.

8. The computer-implemented method of claim 1 wherein the error is caused by movement of an analytical element away from a corresponding physical element.

9. A machine-readable storage device having instructions stored thereon that, when executed by data processing apparatus, cause the data processing apparatus to perform operations comprising:
identifying an analytical representation of a plurality of physical elements in a computer aided design (CAD) model, the analytical representation comprising a plurality of wire frame elements associated with connectivity conditions, one or more of the plurality of analytical elements corresponding to one or more of the plurality physical elements;
establishing an association between corresponding analytical and physical elements such that a modification to one element causes a modification to a corresponding other; and
detecting an error when a distance between a wireframe element and a corresponding physical element is greater than a tolerance distance.

10. The machine-readable storage device of claim 9, wherein the operations further comprise providing notification of the error through a user interface.

11. The machine-readable storage device of claim 9, wherein detecting is in response to user input modifying the CAD model or the analytical representation.

12. The machine-readable storage device of claim 9, wherein the error is one of: a support distance error, an analytical element to a physical element distance error, or an analytical adjustment distance error.

13. The machine-readable storage device of claim 9, wherein the error is caused by movement of an analytical element away from a corresponding physical element.

14. The machine-readable storage device of claim 9 wherein detecting is in response to the identification of an association between corresponding analytical and physical elements.

15. The machine-readable storage device of claim 9, wherein the operations further comprise performing a structural analysis of the analytical representation.

16. The machine-readable storage device of claim 9, wherein the operations further comprise:
receiving user input first modifying a physical element or an analytical element; and
modifying a corresponding other in response.

17. A system comprising:
one or more computers configured to execute instructions to perform operations comprising:
identifying an analytical representation of a plurality of physical elements in a computer aided design (CAD) model, the analytical representation comprising a plurality of wire frame elements associated with connective conditions, one or more of the plurality of analytical elements corresponding to one or more of the plurality physical elements;
establishing an association between corresponding analytical and physical elements such that a modification to one element causes a modification to a corresponding other; and
detecting an error when a distance between a wireframe element and a corresponding physical element is greater than a tolerance distance.

18. The system of claim 17, wherein the operations further comprise providing notification of the error through a user interface.

19. The system of claim 17 wherein detecting is in response to user input modifying the CAD model or the analytical representation.

20. The system of claim 17 wherein the error is one of: a support distance error, an analytical element to a physical element distance error, or an analytical adjustment distance error.

21. The system of claim 17, wherein the error is caused by a movement of an analytical element away from a corresponding physical element.

22. The system of claim 17 wherein detecting is in response to the identification of an association between corresponding analytical and physical elements.

23. The system of claim 17, wherein the operations further comprise performing a structural analysis of the analytical representation.

24. The system of claim 17, wherein the operations further comprise:
receiving user input first modifying a physical element or an analytical element; and
modifying a corresponding other in response.

* * * * *

UNITED STATES PATENT AND TRADEMARK OFFICE
CERTIFICATE OF CORRECTION

| | | |
|---|---|---|
| PATENT NO. | : 8,099,260 B2 | |
| APPLICATION NO. | : 11/460524 | |
| DATED | : January 17, 2012 | |
| INVENTOR(S) | : Emile E. Kfouri | |

It is certified that error appears in the above-identified patent and that said Letters Patent is hereby corrected as shown below:

On Title Page 1, Item [56], Column 2, Line 5, delete "elements. one" and insert -- elements. One --

On Title Page 1, Item [56], Column 2, Line 6, delete "plurality physical" and insert
-- plurality of physical --

Column 14, Line 59-60, delete "plurality physical" and insert
-- plurality of physical --

Column 15, Line 34-35, delete "plurality physical" and insert
-- plurality of physical --

Column 16, Line 10, in Claim 16, after "input" delete "first"

Column 16, Line 22, Claim 17, delete "plurality physical" and insert
-- plurality of physical --

Column 16, Line 51, Claim 24, after "input" delete "first"

Signed and Sealed this
Third Day of April, 2012

David J. Kappos
*Director of the United States Patent and Trademark Office*